United States Patent
Fujii et al.

(10) Patent No.: US 8,449,083 B2
(45) Date of Patent: May 28, 2013

(54) MULTILAYER BODY, PIEZOELECTRIC ELEMENT, AND LIQUID EJECTING DEVICE

(75) Inventors: Takamichi Fujii, Kanagawa (JP); Takami Arakawa, Kanagawa (JP); Takayuki Naono, Kanagawa (JP); Yoshikazu Hishinuma, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 603 days.

(21) Appl. No.: 12/538,977

(22) Filed: Aug. 11, 2009

(65) Prior Publication Data

US 2010/0039482 A1 Feb. 18, 2010

(30) Foreign Application Priority Data

Aug. 12, 2008 (JP) ................. 2008-207690

(51) Int. Cl.
*B41J 2/045* (2006.01)

(52) U.S. Cl.
USPC .......................................................... 347/68

(58) Field of Classification Search
USPC ............ 347/68; 29/25.35, 890.1; 252/62.9 R, 252/62.9 PZ; 310/364
See application file for complete search history.

(56) References Cited

U.S. PATENT DOCUMENTS

| | | | |
|---|---|---|---|
| 5,422,307 A | 6/1995 | Ishii | |
| 6,398,349 B1 | 6/2002 | Murai | |
| 7,206,173 B2 * | 4/2007 | Mizuguchi | 360/324 |
| 7,291,960 B2 * | 11/2007 | Iwashita et al. | 310/363 |
| 2004/0135144 A1 | 7/2004 | Yamada et al. | |
| 2009/0176345 A1 | 7/2009 | Saita et al. | |

FOREIGN PATENT DOCUMENTS

| | | |
|---|---|---|
| JP | 5-326518 A | 12/1993 |
| JP | 6-49638 A | 2/1994 |
| JP | 6-305897 A | 11/1994 |
| JP | 9-116111 A | 5/1997 |
| JP | 2002-164586 A | 6/2002 |
| JP | 2003-158309 A | 5/2003 |
| JP | 2003-198319 A | 7/2003 |
| JP | 2003-313594 A | 11/2003 |
| JP | 2008-4782 A | 1/2008 |
| WO | 99/45598 A1 | 9/1999 |
| WO | WO 2007/013604 A1 | 2/2007 |
| WO | WO 2007123539 A1 * | 11/2007 |

OTHER PUBLICATIONS

Office Action dated Mar. 5, 2013, issued in corresponding Japanese Patent Application No. 2008-207690 (Partial English Translation is provided).

* cited by examiner

*Primary Examiner* — Matthew Luu
*Assistant Examiner* — Lisa M Solomon
(74) *Attorney, Agent, or Firm* — Birch, Stewart, Kolasch & Birch, LLP

(57) ABSTRACT

A multilayer body which includes a low-resistance metal layer having a low electrical resistance, excellent thermal resistance and low surface irregularity is provided. The multilayer body includes a substrate, and a low-resistance metal layer which is formed on the substrate and has a single-layer structure or a multilayer structure of two or more sublayers. The low-resistance metal layer includes a gold-containing layer or sublayer composed of gold and another metal.

15 Claims, 11 Drawing Sheets

MULTILAYER BODY, PIEZOELECTRIC ELEMENT, AND LIQUID EJECTING DEVICE

This application claims priority to Japanese Patent Application No. 2008-207690, filed Aug. 12, 2008, the contents of which are incorporated herein by reference in their entirety. In addition, the entire contents of all patents and references cited in this specification are also incorporated herein by reference.

BACKGROUND OF THE INVENTION

The present invention relates to a multilayer body, a piezoelectric element, and a liquid ejecting device. More specifically, the invention relates to a multilayer body having a substrate and a low-resistance metal layer, a piezoelectric element in which such a multilayer is used, and a liquid ejecting device which includes such a piezoelectric element.

Piezoelectric elements having a piezoelectric film endowed with piezoelectric properties that expands and contracts with the rise and fall in the intensity of an applied electric field and electrodes that apply an electric field to the piezoelectric film are used in, for example, the actuators built into ink-jet recording heads. Ink-jet recording heads have a construction that includes a pressure chamber which communicates with an ink feed chamber, and ink ejection ports which communicate with the pressure chamber. A vibration plate having a piezoelectric element bonded thereto is provided in the pressure chamber. In such a construction, by applying a specific voltage to the piezoelectric element and causing it to expand or contract, flexural oscillations are generated, which oscillations in turn compress the ink within the pressure chamber, causing droplets of ink to be ejected from the ink ejection ports.

The piezoelectric element used in such an ink-jet recording head is generally composed of a piezoelectric layer and two electrode layers—an upper electrode layer and a lower electrode layer—on either side of the piezoelectric layer. Of these, it is desired that the lower electrode layer have a low electrical resistance and good thermal resistance. For example, in the piezoelectric vibratory element described in JP 2003-158309 A, the material making up this lower electrode layer is composed primarily of one of the following: platinum, gold, silver, rhodium, rhenium, osmium or iridium. In the thin-film piezoelectric element described in JP 2002-164586 A, the lower electrode layer contains at least one of the following: platinum, iridium, palladium, rhodium or gold. Of these materials, a gold layer—i.e., a layer containing gold as a constituent material—is disclosed on account of the excellent thermal resistance and other properties of such a layer.

SUMMARY OF THE INVENTION

However, the inventors have studied metal layers that include a sublayer made of gold as the lower electrode layer material, as a result of which they have discovered that when such a metal layer forms it has unacceptably large surface irregularities. The inventors have also found that when a metal layer containing such a gold sublayer is used as the lower electrode layer, it affects the orientation and other properties of the piezoelectric layer (e.g., lead zirconate titanate (PZT)) that is formed on the lower electrode film, making it impossible to obtain the desired crystalline phase (e.g., perovskite crystal) and giving the piezoelectric layer a rough surface shape. This leads to a variability in performance as a piezoelectric element, and a lower production yield. The surface irregularity in turn gives rise to electric field concentration, adversely affecting the durability of the piezoelectric element and lowering the performance of ink-jet heads and the like in which such piezoelectric elements and related devices are used.

It is therefore an object of the present invention to provide a multilayer body which includes a low-resistance metal layer having a low electrical resistance, excellent thermal resistance and low surface irregularity. Another object of the invention is to provide a piezoelectric element which is formed on such a multilayer body and has a high-quality piezoelectric layer with little variability in film quality and a low surface roughness. A further object of the invention is to provide a liquid ejecting device within which such piezoelectric elements can be arranged in a high density and which is capable of accurately, reliably and stably discharging even very small liquid droplets.

The inventors have discovered that by including as well a metal other than gold in such a sublayer composed of gold (Au), a low-resistance metal layer having a low surface irregularity can be obtained.

In order to achieve the above object, a first aspect of the present invention provides a multilayer body comprising: a substrate, and a low-resistance metal layer which is formed on the substrate and has a single-layer structure or a multi-layer structure of two or more sublayers; wherein the low-resistance metal layer comprises a gold-containing layer or sublayer composed of gold and another metal.

Preferably, the low-resistance metal layer comprises the gold-containing sublayer and a metal sublayer formed on the gold-containing sublayer, which metal sublayer is situated at a surfacemost portion of the low-resistance metal layer.

Preferably, the low-resistance metal layer has, at a top surface thereof, a mean surface roughness Ra of not more than 10 nm.

Preferably, the low-resistance metal layer further comprises, between the gold-containing sublayer and the metal sublayer, an adhesive metal sublayer.

The metal sublayer is preferably composed of iridium or platinum.

The other metal is preferably iridium.

Preferably, the low-resistance metal layer further comprises, on a substrate side thereof, an adhesive metal sublayer which causes the gold-containing sublayer and the substrate to mutually adhere.

The substrate is preferably a silicon substrate alone or a silicon substrate having a thermal oxide film on a side thereof where the low-resistance metal layer is formed.

Preferably, the low-resistance metal layer has a sheet resistivity of not more than 1Ω/□.

Preferably, the low-resistance metal layer has a percent change in sheet resistivity, before and after heat treatment in open air at a temperature of at least 450° C., of not more than ±20%.

Preferably, the gold-containing sublayer has a content of the other metal of from 0.5 to 50 at %.

Preferably, the low-resistance metal layer has a thickness of from 200 to 1,000 nm.

The low-resistance metal layer is preferably an electrode layer over which a piezoelectric layer is formed.

In order to achieve the above another object, a second aspect of the present invention provides a piezoelectric element comprising the multilayer body according to the first aspect, which piezoelectric element further comprises: an electrode substrate wherein the low-resistance metal layer serves as a lower electrode layer, a piezoelectric layer formed on the lower electrode layer of the electrode substrate, and an upper electrode layer formed on the piezoelectric layer.

The piezoelectric layer is preferably obtained by heating the lower electrode layer at a temperature of at least 450° C. and using a vapor deposition process to form a piezoelectric material thereon.

The piezoelectric layer is preferably a perovskite oxide film.

Preferably, the piezoelectric layer has, at a top surface thereof, a mean surface roughness Ra of not more than 10 nm.

In order to achieve the above another object, a third aspect of the present invention provides a liquid ejecting device comprising: the piezoelectric element according to the second aspect, a liquid holding chamber for holding a liquid, and a liquid ejection port which, on application of a voltage to the piezoelectric element, is made to outwardly eject the liquid from the liquid holding chamber.

The invention thus provides a multilayer body which includes a low-resistance metal layer having a low electrical resistance, excellent thermal resistance, and low surface irregularity; a piezoelectric element which is formed on such a multilayer body and has a high-quality piezoelectric layer with little variability in film quality and a low surface roughness; and a liquid ejecting device within which such piezoelectric elements can be arranged in a high density and which is capable of accurately, reliably and stably discharging even very small liquid droplets.

BRIEF DESCRIPTION OF THE DIAGRAMS

Figure 7:
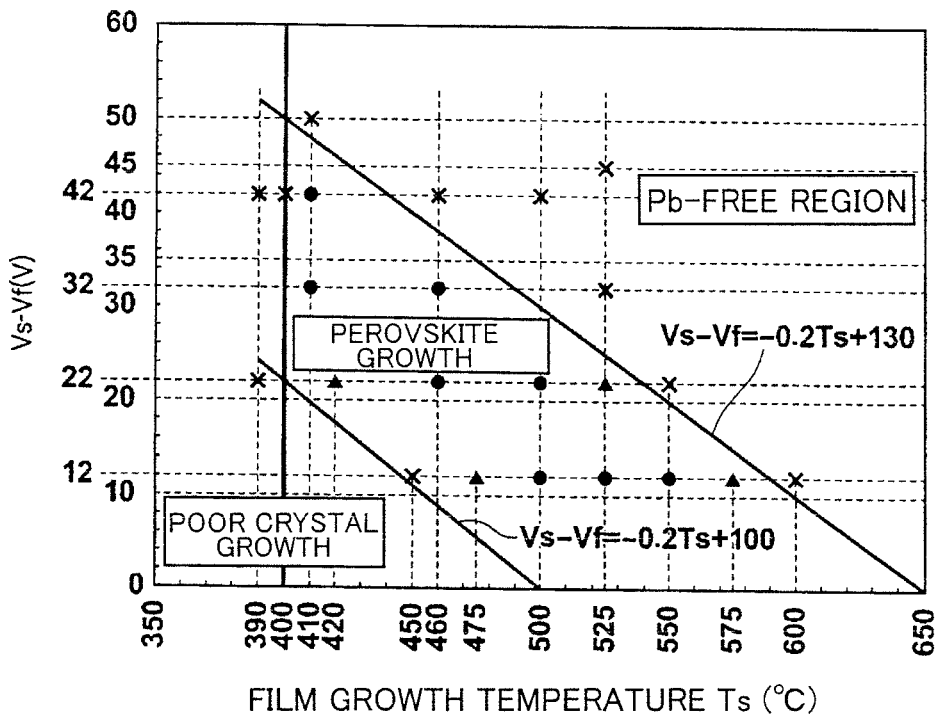
Figure 8:
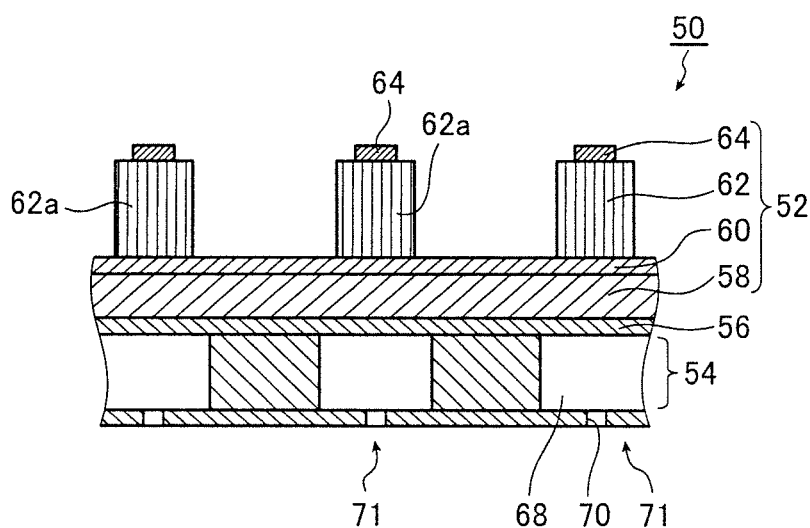
Figure 9:
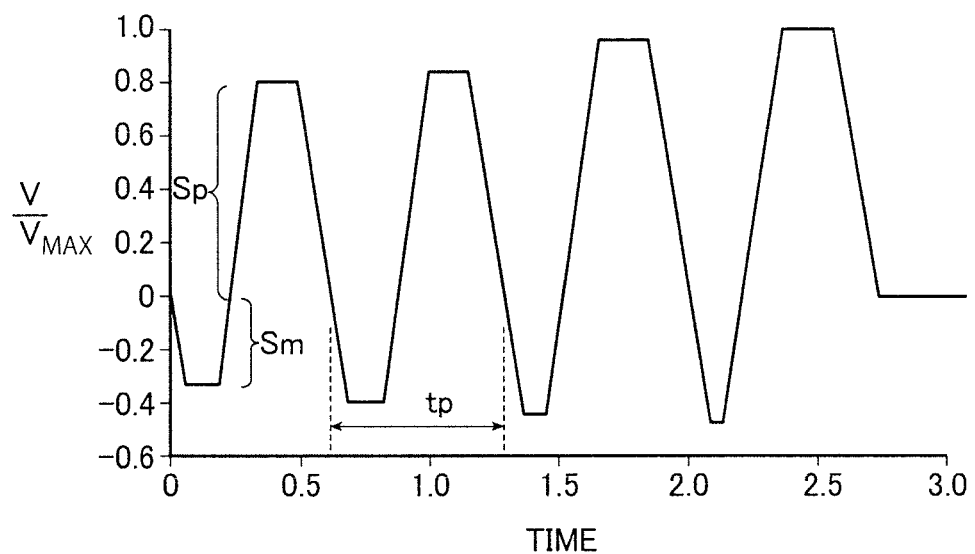
Figure 10:
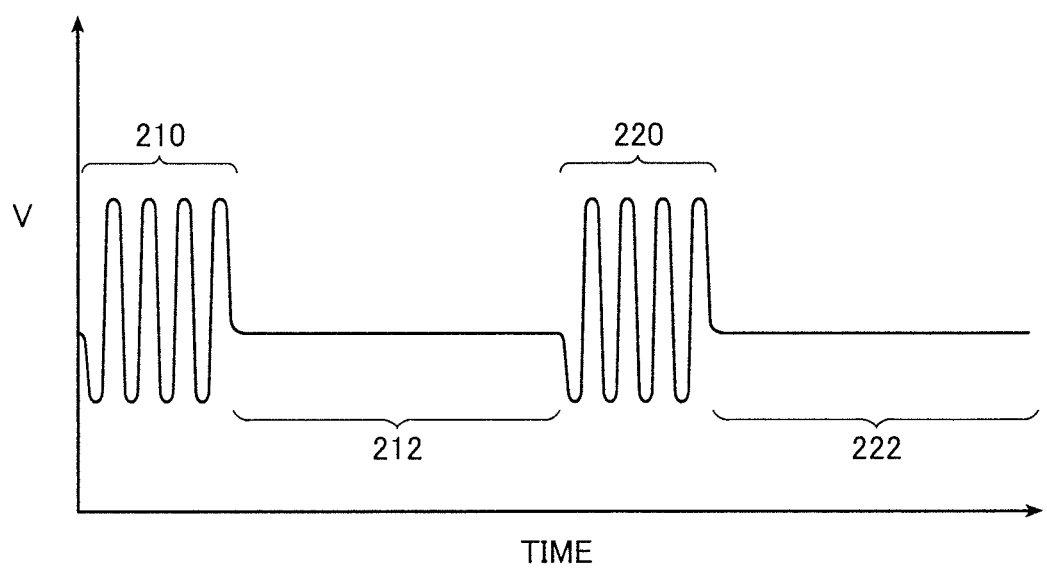
Figure 11:
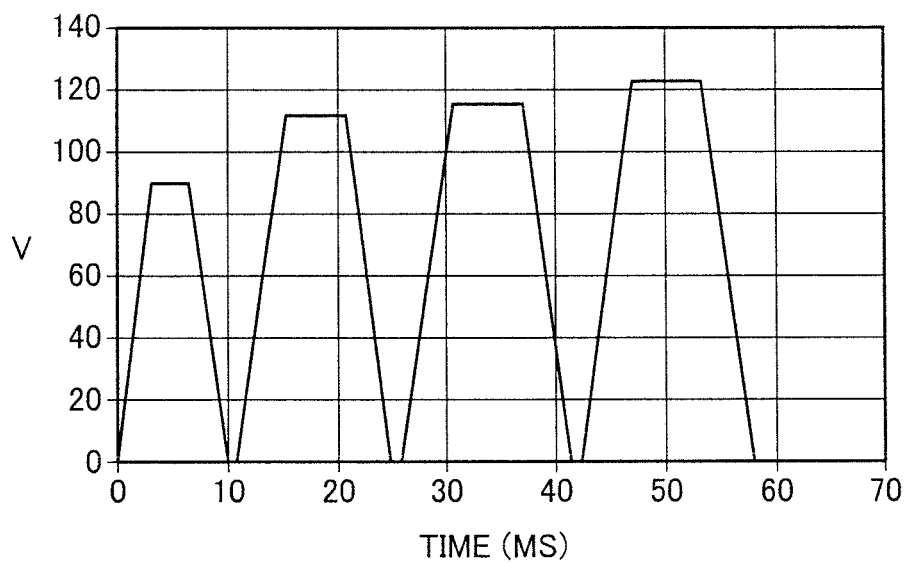
Figure 13:
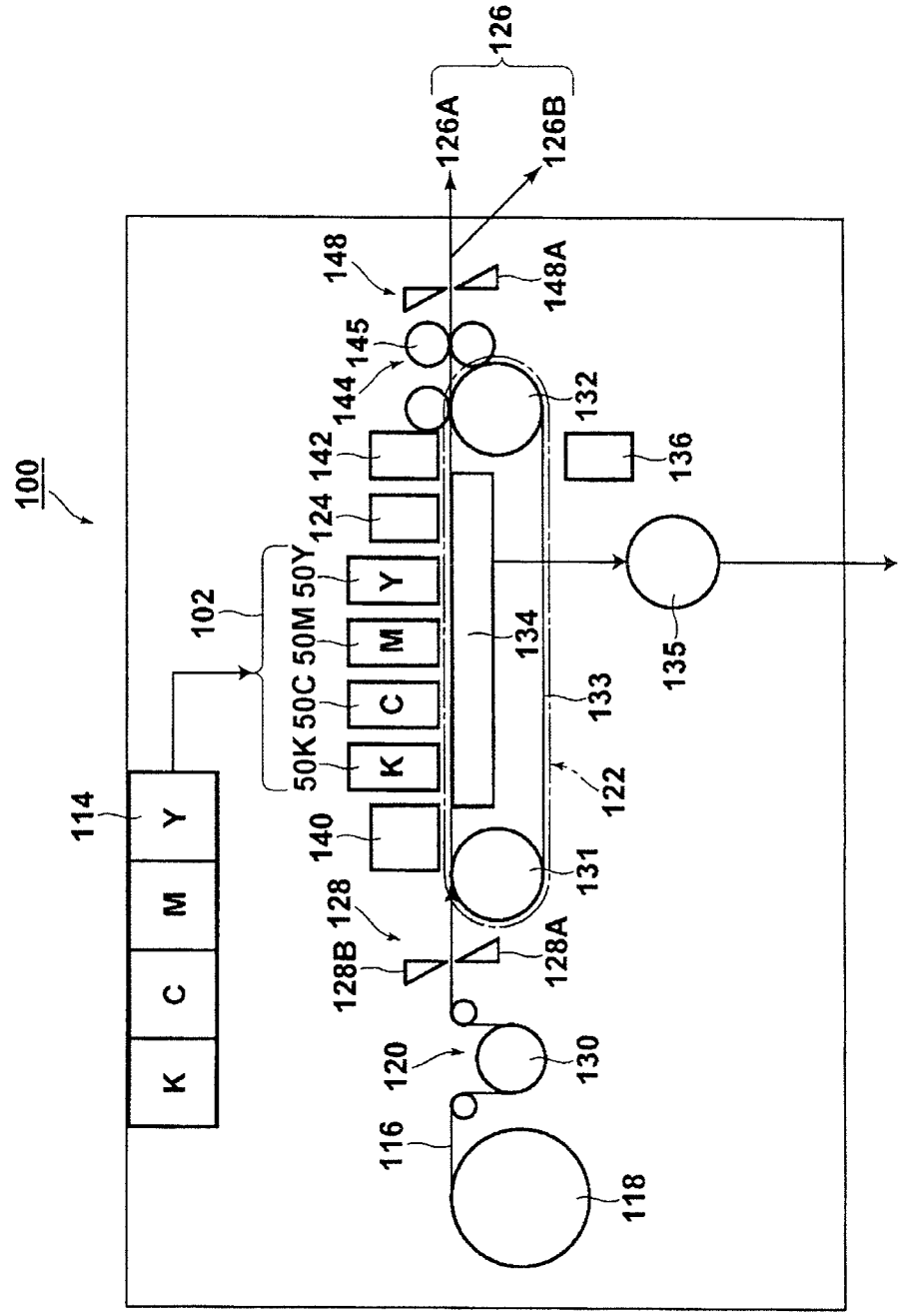
Figure 14:
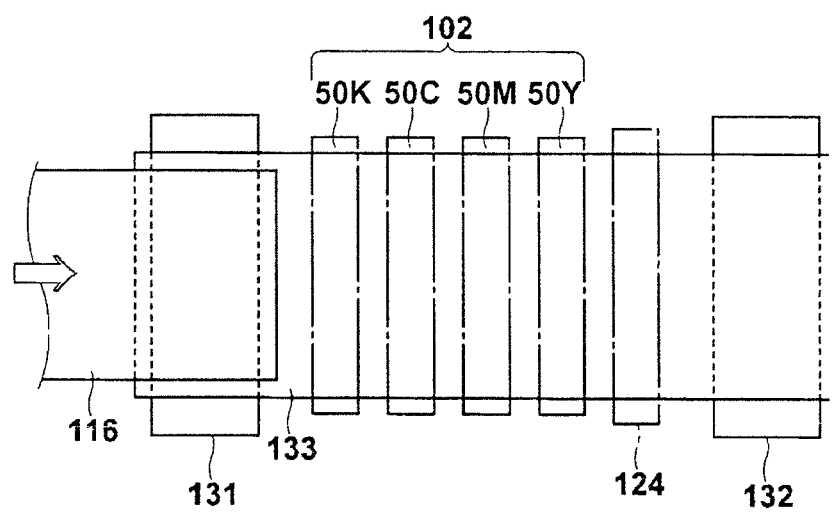
Figure 15:
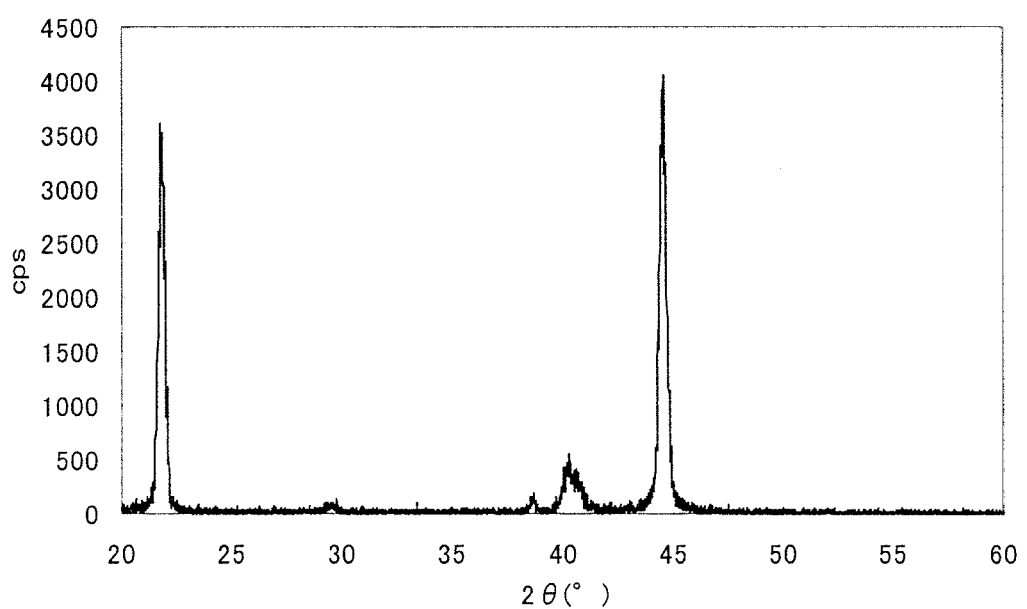
Figure 16:
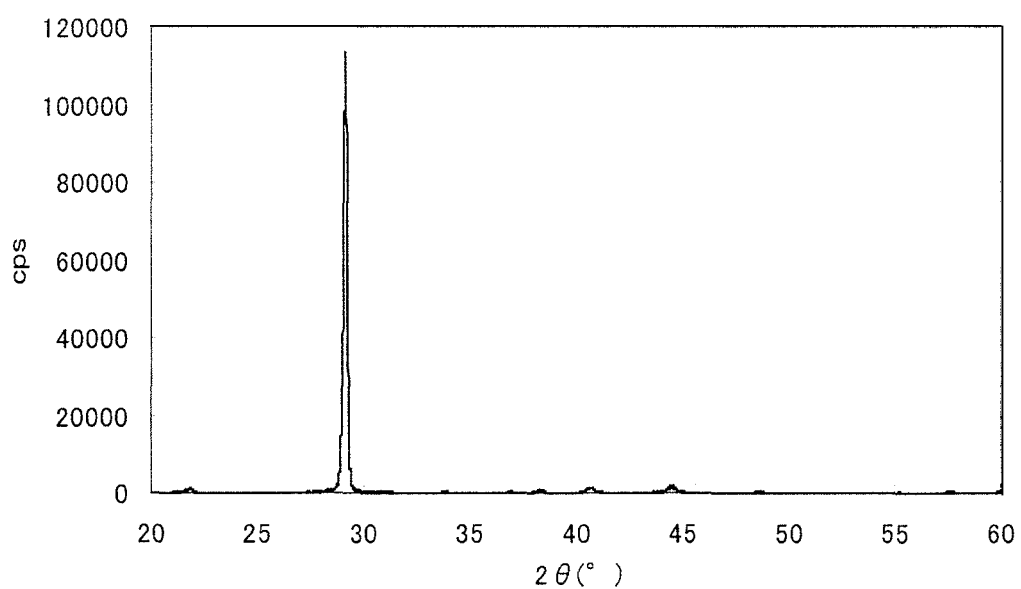

FIG. 7 plots the x-ray diffraction analysis results for samples obtained by film deposition under desired conditions, with the film deposition temperature Ts as the abscissa and Vs as the ordinate;

FIG. 8 is a sectional view showing the structure of an embodiment of a piezoelectric element according to the invention and an ink-jet head using such elements;

FIG. 9 is a graph showing an example of a bipolar waveform for driving the ink-jet head shown in FIG. 8;

FIG. 10 is a graph showing an example of a unipolar waveform for driving the ink-jet head shown in FIG. 8;

FIG. 11 is a graph of the voltage of a drive signal containing a plurality of multipulse waveforms versus time;

FIGS. 12A to E are schematic diagrams showing examples of the state of ink discharge from an orifice in the ejecting portion of an ink-jet head in response to a multipulse waveform;

FIG. 13 is a structural diagram showing the configuration of an ink-jet recording apparatus having the ink-jet head shown in FIG. 8;

FIG. 14 is a partial top view of the ink-jet recording apparatus shown in FIG. 13;

FIG. 15 is a graph showing the x-ray diffraction pattern of the piezoelectric layer obtained in Example 1; and FIG. 16 is a graph showing the x-ray diffraction pattern of the piezoelectric layer obtained in Comparative Example 1.

DETAILED DESCRIPTION OF THE INVENTION

The multilayer body according to the present invention, the piezoelectric element of the invention having such a multilayer body, and the liquid ejecting device of the invention which uses such a piezoelectric element are described more fully below based on the preferred embodiments shown in the accompanying diagrams.

Figure 1:
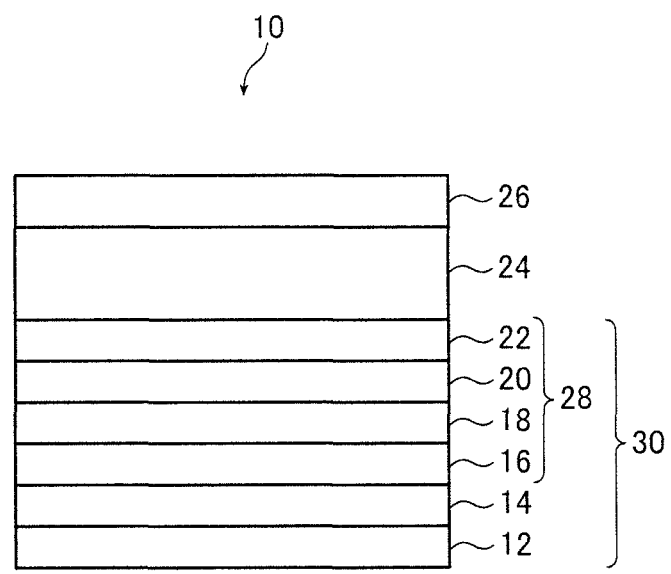
FIG. 1 is a schematic sectional view of an embodiment of a piezoelectric element according to the present invention.

Referring to FIG. 1, which is a schematic sectional view of an embodiment of a piezoelectric element according to the present invention, a piezoelectric element 10 which uses a multilayer body according to the present invention has a layered structure composed of, in order, a substrate 12, a thermal oxide film 14, a first adhesive metal sublayer 16, a gold-containing sublayer 18, a second adhesive metal sublayer 20, a metal sublayer 22, a piezoelectric layer 24, and an upper electrode layer 26.

The first adhesive metal sublayer 16, the gold-containing sublayer 18, the second adhesive metal sublayer 20 and the metal sublayer 22 together make up a low-resistance metal layer 28 which may be used as an electrode layer, especially a lower electrode layer. The substrate 12, the thermal oxide film 14 and the low-resistance metal layer 28 make up the multilayer body 30 of the present invention.

In this and other embodiments of the invention, when the low-resistance metal layer is itself composed of two or more layers, the component layers are referred to herein as "sublayers" to distinguish them from the overall low-resistance metal layer. If the low-resistance metal layer is composed only of a gold-containing layer, the latter is referred to as a "layer" rather than a "sublayer."

First, each of the layers, or sublayers, making up the low-resistance metal layer 28, the multilayer body 30 of the invention, and the piezoelectric element 10 of the invention are described.

The substrate 12 is for depositing thereon and supporting each layer, or sublayer, of the low-resistance metal layer 28, the laminated body 30 of the invention and the piezoelectric element 10 of the invention. The substrate 12 is not subject to any particular limitation, provided the low-resistance metal layer 28 can be deposited thereon. Illustrative examples of suitable substrates include semiconductor substrates (e.g., silicon substrates, silicon carbide substrates), glass substrates, stainless steel (SUS) substrates, yttria-stabilized zirconia (YSZ) substrates, alumina substrates and sapphire substrates. Of these, silicon substrates and stainless steel substrates are preferred on account of their excellent thermal resistance and amenability to processing.

The thermal oxide film 14 is formed when the substrate 12 is heated in an oxidizing atmosphere. For example, when use has been primarily made of a silicon substrate as the substrate 12, the thermal oxide film 14 is a silicon dioxide ($SiO_2$) film that forms at the surface of the silicon substrate 12 on the side where the low-resistance metal layer 28 is to be formed. The thermal oxide film 14 has a thickness which, while not subject to any particular limitation, is preferably from 10 to 3,000 nm, and more preferably from 100 to 500 nm.

It should be noted that the thermal oxide film 14 need not necessarily be included in the piezoelectric element 10 or multilayer body 30 of the present invention.

The purpose of the first adhesive metal sublayer 16 is to improve adhesion between the substrate 12, especially the substrate 12 on which a thermal oxide film 14 has been formed, and the gold-containing sublayer 18 of the low-resistance metal layer 28 formed on the substrate 12. The material making up the first adhesive metal sublayer 16 is not subject to any particular limitation, so long as adhesion between the substrate 12, particularly the thermal oxide film 14, and the gold-containing sublayer 18 is good. Illustrative examples of suitable materials include titanium (Ti), tungsten (W), titanium-tungsten (Ti—W) alloys and nickel-chromium (Ni—Cr) alloys. The first adhesive metal sublayer 16 has a thickness of preferably from 5 to 100 nm, and more preferably from 20 to 50 nm. By thus providing a first adhesive metal sublayer 16, adhesion between the thermal oxide film 14 and the gold-containing sublayer 18 is further improved.

In the piezoelectric element 10 and the multilayer body 30 of the invention, if adhesion between the substrate 12 and the gold-containing sublayer 18 is good, the first adhesive metal sublayer 16 need not be provided.

The gold-containing sublayer 18 is formed on the substrate 12, with the thermal oxide film 14 and the first adhesive metal sublayer 16 interposed therebetween. The gold-containing sublayer 18, which is a critical portion of the low-resistance metal layer 28 that confers a low resistance, is a metal sublayer composed of gold and another metal other than gold, although it contains low-resistance gold (Au) as the main ingredient. The metal other than gold is preferably a material which does not readily form an alloy with gold (Au), such as iridium (Ir), platinum (Pt), chromium (Cr), titanium (Ti) or molybdenum (Mo). Although this material is not subject to any particular limitation, the use of iridium, molybdenum, or a combination thereof, is preferred for enabling the low-resistance metal layer 28 which includes the gold-containing sublayer 18 to achieve a smaller surface irregularity. Iridium is especially preferred. The content of the other metal in the gold-containing sublayer 18 is preferably from 0.5 to 50 at %, and more preferably from 5 to 20 at %. A content within this range is preferred in terms of the resistivity and the surface properties.

The gold-containing sublayer 18 has a thickness of preferably from 200 to 1,000 nm, and more preferably from 300 to 500 nm. A thickness within the above range is desirable in terms of the sheet resistivity.

The gold-containing sublayer 18 may be patterned in a predetermined shape by wet etching using a technique such as photolithography. The etchant used at the time of wet etching is exemplified by an aqueous solution of iodine and potassium iodide.

The purpose of the second adhesive metal sublayer 20 is to improve adhesion between the gold-containing sublayer 18 and the metal sublayer 22 formed thereupon. The material making up the second adhesive metal sublayer 20 is not subject to any particular limitation, provided a good adhesion is achieved between the gold-containing sublayer 18 and the metal sublayer 22. For example, use may be made of a material similar to that used in the first adhesive metal sublayer 16. The second adhesive metal sublayer 20 may be given a thickness similar to that of the first adhesive metal sublayer 16. By thus providing such a second adhesive metal sublayer 20, adhesion between the gold-containing sublayer 18 and the metal sublayer 22 can be further improved.

In the piezoelectric element 10 and the multilayer body 30 of the present invention, if adhesion between the gold-containing sublayer 18 and the metal sublayer 22 is good, the second adhesive metal sublayer 20 need not be provided.

The metal sublayer 22 is formed over the gold-containing sublayer 18 with the adhesive metal sublayer 20 therebetween, and is situated at the surfacemost portion of the low-resistance metal layer 28 on the opposite side thereof from the substrate 12. When the low-resistance metal layer 28 is used as an electrode, particularly a lower electrode, the metal sublayer 22 is provided for the purpose of suitably controlling the state of the layer deposited thereon; e.g., in the illustrated embodiment, the orientation of the piezoelectric layer 24.

The primary metal making up this metal sublayer 22 is not subject to any particular limitation. However, preferred examples from the standpoint of better orientation control of the piezoelectric layer 24 formed on the low-resistance metal layer 28 include iridium and platinum. Iridium is more preferred.

The metal sublayer 22 has a thickness of preferably from 50 to 300 nm, and more preferably from 100 to 200 nm. At a thickness within the above range, better orientation of the piezoelectric layer 24 is achieved.

In the piezoelectric element 10 and multilayer body 30 of the invention, if orientation control of the piezoelectric layer 24 deposited on the low-resistance metal layer 28 is sufficient, the metal sublayer 22 need not be provided.

When constructing the piezoelectric element 10 of the invention, in cases where the low-resistance metal layer 28 of the inventive multilayer body 30 is used as the lower electrode, the piezoelectric layer 24 is deposited on the low-resistance metal layer 28, and specifically, on the metal sublayer 22.

The piezoelectric layer 24, while not subject to any particular limitation, is preferably exemplified by a piezoelectric film composed of one or a plurality of perovskite oxides (perovskite oxide film). The perovskite oxide may be one having paraelectricity or one having ferroelectricity. One having ferroelectricity may be advantageously used in ferroelectric devices such as piezoelectric elements and ferroelectric memories.

The perovskite oxide is exemplified by perovskite oxides of general formula (P) below.

$$A_a B_b O_3 \tag{P}$$

In formula (P), A refers to an A site element, which is at least one element, but invariably includes lead. B refers to a B site element, which is at least one element selected from the group consisting of titanium, zirconium, vanadium, niobium, tantalum, chromium, molybdenum, tungsten, manganese, scandium, cobalt, copper, indium, tin, gallium, zinc, cadmium, iron and nickel. A case in which a=1.0 and b=1.0 is standard, although these numerical values may deviate from 1.0 within a range where a perovskite structure is achievable.

Illustrative examples of the perovskite oxide of above general formula (P) include lead-containing compounds such as lead titanate, lead zirconate titanate (PZT), lead zirconate, lead lanthanum titanate, lead lanthanum zirconate titanate, lead magnesium niobate zirconium titanate and lead nickel niobate zirconium titanate; and lead-free compounds such as barium titanate, bismuth sodium titanate, bismuth potassium titanate, sodium niobate, potassium niobate and lithium niobate. The piezoelectric layer may be a perovskite oxide mixed crystal system of the above general formula (P).

The piezoelectric layer 24 is preferably composed of a PZT of general formula (P-1) below, a B site-substituted system thereof, or a mixed crystal system of both.

$$Pb_a(Zr_{b1}Ti_{b2}X_{b3})O_3 \tag{P}$$

In above formula (P-1), X is at least one metal element selected from among group V and group VI elements of the Periodic Table. Also, a 22 0, b1>0, b2>0, and b3≧0. Cases in which a=1.0 and b1+b2+b3=1.0 are standard. However, these numerical values may deviate from 1.0 within a range where a perovskite structure is achievable.

When b3=0, the perovskite oxide of above general formula (P-1) is lead titanate zirconate (PZT). When b3>0, the perovskite oxide of general formula (P-1) is an oxide in which some of the B sites in PZT have been substituted with at least one metal element selected from among group V and group VI elements.

X may be a metal element selected from groups VA, VB, VIA and VIB of the Periodic Table, and is preferably at least one element selected from the group consisting of vanadium, niobium, tantalum, chromium, molybdenum and tungsten.

From the standpoint of application in liquid ejecting devices such as the subsequently described ink-jet recording devices, the piezoelectric layer 24 has, at a top surface thereof, a mean roughness Ra of preferably not more than 10 nm, more preferably not more than 8 nm, and most preferably not more than 7 nm. It is desirable for the lower limit in the mean surface roughness Ra to be as small as possible, and preferably 0. A mean surface roughness Ra within the above range is advantageous because, during use as a piezoelectric element, electric field concentration due to surface irregularities is suppressed.

The mean surface roughness Ra (arithmetic mean roughness Ra), which is a value represented by the symbol Ra according to JIS B0601-1994, refers to the mean absolute deviation from a mean line by surface roughness values. Measurement may be carried out with a surface profilometer at three or more randomly selected points.

The piezoelectric layer 24 has a thickness which, although not subject to any particular limitation, is preferably from 1 to 10 μm, more preferably from 2 to 7 μm, and even more preferably from 3 to 5 μm. A thickness within the above range is advantageous from the standpoint of ejection force and output rate design.

The piezoelectric layer 24, as subsequently described, is preferably composed of a piezoelectric material formed on the metal sublayer 22 at a film-forming temperature of at least 450° C. using a vapor deposition process.

The upper electrode layer 26 is deposited on the piezoelectric layer 24. Together with the low-resistance metal layer 28 which functions as the lower electrode layer, the upper electrode layer 26 sandwiches therebetween and energizes the piezoelectric layer 24.

The primary constituent in the upper electrode layer 26 is not subject to any particular limitation. Illustrative examples include electrode materials, such as aluminum, tantalum, chromium and copper, which are used in ordinary semiconductor processes, and combinations thereof.

The upper electrode layer 26 has a thickness which, although not subject to any particular limitation, is preferably from 50 to 500 nm, and more preferably from 100 to 200 nm.

Next, the low-resistance metal layer 28 composed of the various sublayers described above, and the multilayer body 30 and piezoelectric element 10 of the invention, are described.

[Low-Resistance Metal Layer]

The low-resistance metal layer 28 in the illustrated example is composed of a first adhesive metal sublayer 16, a gold-containing sublayer 18, a second adhesive metal sublayer 20 and a metal sublayer 22. However, the present invention is not limited in this regard. For example, if it includes a gold-containing sublayer 18 composed of gold and another metal, the low-resistance metal layer 28 may be composed of what is in fact a single layer or may have a multilayer construction of two or more sublayers. The low-resistance metal layer 28 has a film thickness of preferably from 200 to 1,000 nm, and more preferably from 300 to 600 nm. A thickness within the above range is preferred from the standpoint of the sheet resistivity.

The low-resistance metal layer 28 has a sheet resistivity which, from the standpoint of use in a piezoelectric element 10, is preferably not more than 1Ω/□, and more preferably not more than 0.5Ω/□. Measurement of the sheet resistivity is typically carried out by the four-point probe method, preferably in accordance with JIS K7194. A sheet resistivity within the above range is desirable because heat generation by the electrode during operation can be suppressed.

Moreover, the low-resistance metal layer 28 has a percent change in sheet resistivity, before and after heat treatment in open air at a temperature of at least 450° C., of preferably not more than ±20%, and more preferably not more than ±10%. It is desirable for the lower limit in the percent change to be as small as possible, and preferably 0. A percent change within the above range is advantageous because the subsequently described device design is easy. The percent change is calculated as shown below.

Percent change (%)=[(sheet resistivity after heating−sheet resistivity before heating)/(sheet resistivity before heating)]×100

From the standpoint of use in a piezoelectric element 10, and specifically to enhance durability during operation, the low-resistance metal layer 28 has, on a top surface thereof, a mean surface roughness Ra of preferably not more than 10 nm, more preferably not more than 8 nm, and most preferably not more than 7 nm. It is desirable for the lower limit in the mean surface roughness Ra to be as small as possible, and preferably 0. As noted above, the mean surface roughness Ra (JIS B0601-1994) refers to the mean absolute deviation from a mean line by surface roughness values, and is typically measured with a surface profilometer at three or more randomly selected points.

[Multilayer Body]

The multilayer body 30 shown in FIG. 1 is composed of a substrate 12, a thermal oxide film 14, and a low-resistance metal layer having a first adhesive metal sublayer 16, a gold-containing sublayer 18, a second adhesive metal sublayer 20 and a metal sublayer 22.

In the multilayer body 30, the low-resistance metal layer 28 may be employed as an electrode layer, particularly a lower electrode layer, enabling the multilayer body 30 to be used as a member of various devices. For example, the multilayer body 30 may be advantageously used in piezoelectric elements for use in, devices such as ink-jet recording heads, ferroelectric memories (FRAM), micropumps and pressure sensors.

In the multilayer body 30 according to the present invention, the low-resistance metal layer 28 having a gold-containing sublayer 18 which includes gold and another metal has little surface irregularity. While the specific reasons are not entirely clear, including a metal other than gold within the gold-containing layer 18 presumably suppressed crystal growth by gold particles.

Although the multilayer body 30 shown in FIG. 1 is composed of a substrate 12, a thermal oxide film 14 and a low-resistance metal layer 28, the multilayer body according to this invention is not limited in this respect. That is, the multilayer body of the invention may be any multilayer body which has a substrate and a low-resistance metal layer that is formed on the substrate and has a single-layer structure or a multilayer structure of two or more sublayers, and wherein the low-resistance metal layer includes a gold-containing layer or sublayer composed of gold and another metal.

[Piezoelectric Element]

The piezoelectric element 10 shown in FIG. 1 has an electrode substrate wherein the low-resistance metal layer 28 in the multilayer body 30 serves as a lower electrode layer, a piezoelectric layer 24 which is formed on the lower electrode layer of this electrode substrate, and an upper electrode substrate 26 which is formed on the piezoelectric layer.

The piezoelectric element of the invention generates a voltage when a force such as vibrations or pressure is applied thereto or, conversely, expands and contracts when a voltage is applied between the lower electrode layer and the upper electrode layer. Because the piezoelectric element can be made to undergo subtle dimensional changes (expansion/contraction) under voltage control, it is employed in ink ejecting mechanisms for ink-jet printers and in control mechanisms such as actuators. In addition, it may also be used as an oscillator for oscillation circuits in analog electronic circuitry.

As described above, the low-resistance metal layer 28 of the multilayer body 30 used in the piezoelectric element 10 shown in FIG. 1 has a multilayer structure of two or more sublayers which is composed of, for example, a first adhesive metal sublayer 16, a gold-containing sublayer 18, a second adhesive metal sublayer 20 and a metal sublayer 22. However, the piezoelectric element of the invention and the inventive multilayer body used therein may instead include a low-resistance metal layer having a single-layer structure, provided the single layer is a gold-containing layer composed of at least gold and another metal.

Figure 2:
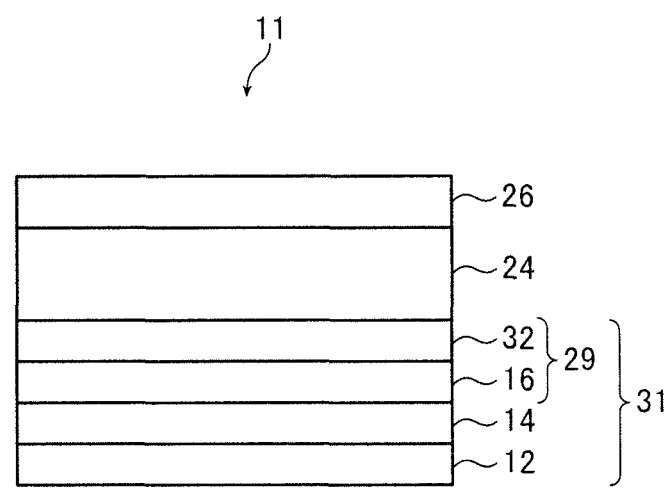
FIG. 2 is a schematic sectional view of another embodiment of a piezoelectric element according to the invention.

FIG. 2 is a schematic sectional view of another embodiment of the piezoelectric element according to the invention which uses the inventive multilayer body having such a low-resistance metal layer.

The piezoelectric element 11 of the invention shown in FIG. 2 has a multilayer structure in which a substrate 12, a thermal oxide film 14, an adhesive metal sublayer 16, a gold-containing sublayer 32, a piezoelectric layer 24 and an upper electrode layer 26 have been deposited in this order.

Aside from having a gold-containing sublayer 32 instead of a gold-containing sublayer 18, a second adhesive metal sublayer 20 and a metal sublayer 22, the piezoelectric element 11 shown in FIG. 2 is configured in the same way as the piezoelectric element 10 shown in FIG. 1. Accordingly, like elements in both embodiments are denoted by the same reference symbols and repeated explanations of such elements are omitted below.

In the piezoelectric element 11 shown in FIG. 2, the adhesive metal sublayer 16 and the gold-containing sublayer 32 together make up a low-resistance metal layer 29 which can be used in particular as a lower electrode layer. The substrate 12, the thermal oxide film 14 and the low-resistance metal layer 29 make up the multilayer body 31 of the invention. In the present invention, it is not always necessary to include the adhesive metal sublayer 16. In such cases, the low-resistance metal layer 29 may have a single-layer structure composed entirely of the metal-containing sublayer 32.

Here, the gold-containing sublayer 32 of the low-resistance metal layer 29 is deposited over the adhesive metal sublayer 16 and serves as a layer which both has the low resistance of the metal gold-containing sublayer 18 and the metal sublayer 22 of the low-resistance metal layer 28 shown in FIG. 1 and also functions to control the orientation of the piezoelectric layer 24 above it. In the gold-containing sublayer 32, the bottommost portion on the side of the substrate 12 which comes into contact with the adhesive metal sublayer 16 is composed of a metal mixture of gold and another metal and the topmost portion on the side away from the substrate 12 which comes into contact with the piezoelectric layer 24 is made of another metal. Hence, this is a gradient metal layer in which the gold concentration gradually decreases from the lower bottommost portion to the topmost portion. In the gold-containing sublayer 32, the metal other than gold is not subject to any particular limitation. Preferred examples include iridium, molybdenum, titanium, chromium, platinum, and combinations thereof. Of these, iridium is especially preferred.

The content of the other metal in the gold-containing sublayer 32 is preferably from 0.5 to 50 at %, and more preferably from 5 to 20 at %.

The gold-containing sublayer 32 has a thickness of preferably from 200 to 1,000 nm, and more preferably from 300 to 500 nm.

In addition, the rate of change in the gold concentration within the gold-containing sublayer 32, while not subject to any particular limitation, is preferably constant.

[Methods of Manufacturing the Multilayer Body and the Piezoelectric Element]

The respective layers of the multilayer body and the piezoelectric element according to the invention are preferably formed by vapor-phase deposition processes. Illustrative examples of such deposition processes include sputtering, ion beam sputtering, ion plating, and plasma chemical vapor deposition.

Figure 3:
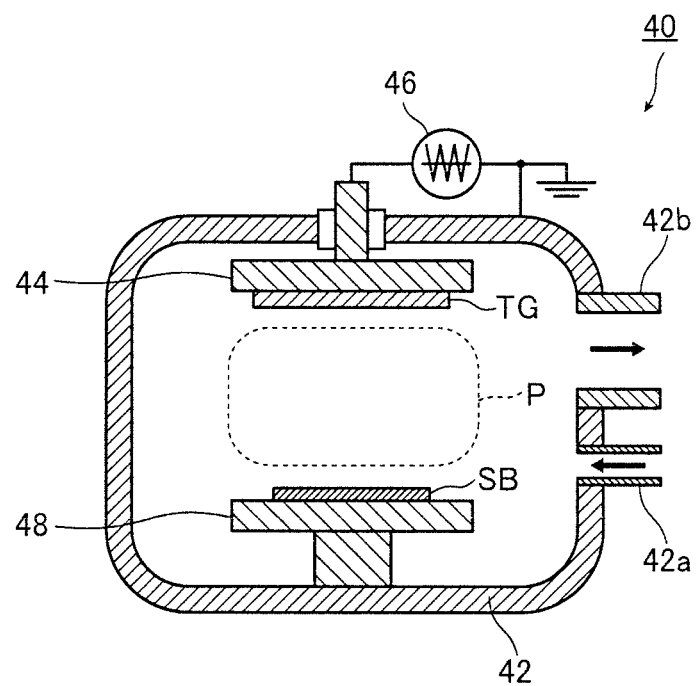
FIG. 3 is a schematic sectional view showing the configuration of a sputtering system for carrying out a sputtering process.

Next, a sputtering system which carries out a sputtering process is described below in conjunction with FIG. 3 as a typical example of a film deposition system which uses a plasma and may be employed for depositing the respective layers of the inventive multilayer body or piezoelectric element by vapor-phase deposition processes. FIG. 3 is a schematic sectional view of an RF sputtering system.

As shown in FIG. 3, a sputtering system 40 of the invention is a system for forming the low-resistance metal layers 28, 29, piezoelectric layer 24, and upper electric layer 26 shown in FIGS. 1 and 2. To be more specific, the inventive sputtering system is an RF sputtering system for depositing thin films on a substrate SB by plasma-enhanced vapor deposition (sputtering) to form the low-resistance metal layers 28, 29, the piezoelectric layer 24 and the upper electric layer 26, thereby fabricating a thin-film device such as a piezoelectric element; the system 40 includes a vacuum vessel 42 having a gas supply pipe 42a and a gas exhaust pipe 42b, a sputter electrode (cathode electrode) 44 provided within the vacuum vessel 42 to hold a target material TG to be sputtered for generating a plasma, an RF power source 46 that is connected to the sputter electrode 44 and which applies radio frequency waves to it, a substrate holder 48 that is provided within the vacuum vessel 42 at a position in a face-to-face relationship with the sputter electrode 44 and which holds the substrate SB on which thin films are to be deposited from the components of the target material TG.

The vacuum vessel 42 is a highly hermetic vessel that is formed of iron, stainless steel, aluminum or the like to maintain a predetermined degree of vacuum for sputtering; in the illustrated case, the vacuum vessel 42 is grounded and equipped with the gas supply pipe 42a for supplying its interior with a gas or gases that are required for film deposition and with the gas exhaust pipe 42b for discharging gases from within the vacuum vessel 42. Examples of the gas that may be introduced into the vacuum vessel 42 through the gas supply pipe 42a include argon (Ar) and a mixture of argon (Ar) and oxygen (O2) gases. The gas supply pipe 42a is connected to a supply source (not shown) of such gases. The gas exhaust pipe 42b is connected to a degassing means such as a vacuum pump for two purposes, one for maintaining a predetermined degree of vacuum within the vacuum vessel 42, and the other for discharging gases from within the vacuum vessel 42 in order to maintain the predetermined degree of vacuum during film deposition.

The vacuum vessel 42 may be of various types that are employed in sputtering systems, including a vacuum chamber, a bell jar, and a vacuum tank.

The sputter electrode 44 is placed in an upper position within the vacuum vessel 42 and it has the target material TG mounted and held on its surface; the target material TG has a composition that fits with the composition of a thin film such as a piezoelectric film to be deposited; the sputter electrode 44 is connected to the RF power source 46.

The RF power source 46 serves to supply the sputter electrode 44 with a sufficient RF power (negative radio frequency waves) to make a plasma of a gas such as Ar that has been introduced into the vacuum vessel 42; one end of the RF power source 46 is connected to the sputter electrode 44 and the other end is grounded. Note that the RF power to be applied from the RF power source 46 to the sputter electrode 44 is not limited to any particular value and it may be exemplified by a RF power of 13.65 MHz up to 5 kW or 1 kW; ranges of RF power that are preferably used include, for example, 50 kHz-2 MHz, 27.12 MHz, 40.68 MHz, 60 MHz and 1 kW-10 kW.

When the sputter electrode 44 is supplied with an RF power (negative radio frequency waves) from the RF power source 46, discharge occurs, whereupon a gas such as Ar that has been introduced into the vacuum vessel 42 forms a plasma to generate positive ions such as Ar ion. Hence, the sputter electrode 44 may also be called a cathode electrode or a plasma electrode.

The thus generated positive ions sputter the target TG held on the sputter electrode 44. The constituent elements of the target material TG thus sputtered with the positive ions are released from the target material TG and vapor-deposited, in either a neutral or ionized state, on the substrate SB held on the substrate holder 48 spaced from and in a face-to-face relationship with the sputter electrode 44.

In this way, as shown by a dashed line in FIG. 3, there is formed a plasma space P within the vacuum vessel 42 that contains positive ions such as Ar ion, the constituent elements of the target material TG, and ions of such elements.

The substrate holder 48 is placed in a lower position within the vacuum vessel 42 that is spaced from and in a face-to-face relationship with the sputter electrode 44; it serves to hold the substrate SB, namely to support it from beneath as seen in FIG. 3, on which the constituent elements (components) of the target material TG held on the sputter electrode 44 are to be vapor-deposited, whereupon a thin film such as a piezoelectric film is deposited. Note that the substrate holder 48 is equipped with a heater (not shown) for heating and maintaining the substrate SB at a predetermined temperature during film deposition on the substrate SB.

It should further be noted here that the sputtering system 40 of the present invention has an essential requirement to meet, which states to the effect that the substrate SB should not be at the ground potential; to this end, the system 40 must be of such a design that the substrate SB held on the substrate holder 48 is not at the ground potential. In other words, the sputtering system 40 needs to be of such a design that the potential of the substrate SB and, hence, the substrate holder 48 is a floating potential.

It should also be noted that the size of the substrate SB to be mounted on the substrate holder 48 is not limited to any particular value and it may be a substrate with an ordinary size of 6 inches or it may be a substrate with a size of 5 or 8 inches; it may even be a substrate with a size of 5 cm by square.

The target-to-substrate distance, or the distance between the target material TG held on the sputter electrode 44 and the substrate SB held on the substrate holder 48, is preferably 10 cm (100 mm) or smaller, and more preferably from 6 cm (60 mm) to 8 cm (80 mm).

The lower limit of the distance between the target material TG and the substrate SB is not particularly critical if a plasma generating discharge is to occur; however, if the distance is unduly small, no discharge will occur, so it is preferably at least 20 cm.

It should be noted here that if the target material TG and the substrate SB are sufficiently thin, the distance between the sputter electrode 44 and the substrate holder 48 can be used as a representative value of the distance between the target material TG and the substrate SB.

The sputtering system of the present invention is basically constructed as shown above and on the following pages, we will describe its operation and the sputtering method of the present invention.

Figure 4:
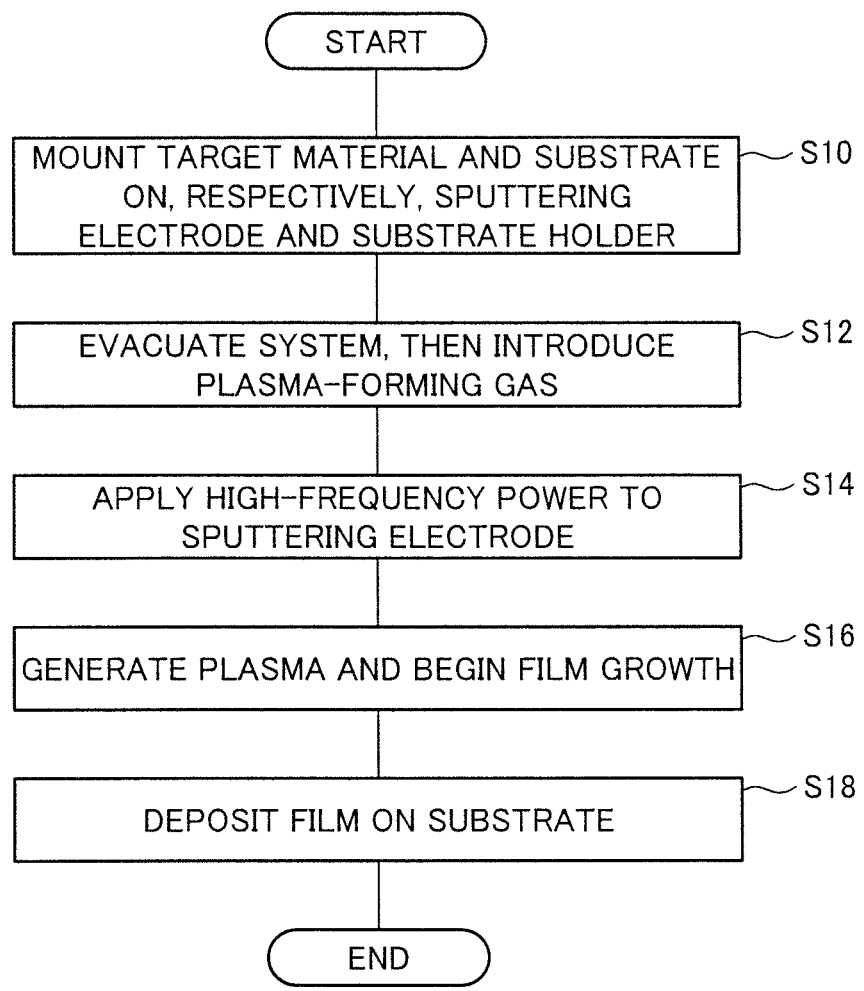
FIG. 4 is a flow chart showing an example of a sputtering process.

FIG. 4 is a flowchart depicting an embodiment of the sputtering method of the present invention.

As FIG. 4 shows, the flowchart starts with step S10 in which the sputtering system 40 shown in FIG. 3 is so conditioned that a target material TG to be sputtered is mounted and held on the sputter electrode 44 provided within the vacuum vessel 42 while, at the same time, a substrate on which to deposit a thin film such as a piezoelectric film is mounted and held on the substrate holder 48 within the vacuum vessel as it is spaced apart from and placed in a face-to-face relationship with the sputter electrode 44.

Thereafter, in step S12, the vacuum vessel 42 is degassed through the gas exhaust pipe 42b until a predetermined degree of vacuum is created in its interior and with continued degassing to maintain the predetermined degree of vacuum, a plasma forming gas such as argon gas (Ar) is kept supplied in a predetermined quantity through the gas supply pipe 42a. Simultaneously with this step, step S14 is performed in which radio frequency waves (a negative RF power) are applied from the RF power source 46 to the sputter electrode 44, whereupon discharge occurs to make a plasma of the gas such as Ar that has been introduced into the vacuum vessel 42 and positive ions such as Ar ion are generated to form a plasma space P.

Then, in step S16, the positive ions within the thus formed plasma space P sputter the target material TG held on the sputter electrode 44 and the constituent elements of the sputtered target material TG are released from the target material TG and vapor-deposited, in either a neutral or ionized state, on the substrate SB held on the substrate holder 48 that is spaced apart and placed in a face-to-face relationship with the sputter electrode 44; this starts the process of film deposition. As a result, thin films can be deposited as in the low-resistance metal layers and piezoelectric layer (step S18).

Next, preferable conditions of film deposition in the film deposition method by sputtering according to the present invention are described.

The conditions of film deposition by the film deposition method by sputtering according to the present invention are preferably determined based on the relation among the film deposition temperature Ts (° C.), Vs−Vf (V) which is the difference between the plasma potential Vs (V) in the plasma and the floating potential Vf (V) of the substrate during film deposition, and the characteristics of the film being deposited.

The film characteristics to be related to Ts and Vs−Vf may be exemplified by the crystal structure of the film and/or its composition.

Figure 5:
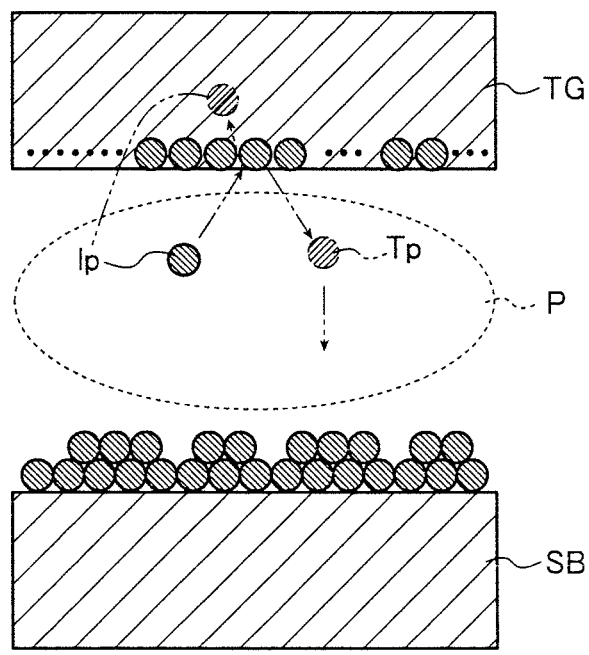
FIG. 5 is a schematic view showing film growth taking place in the sputtering system of FIG. 3.

FIG. 5 is a diagram showing schematically how a film is deposited in the sputtering system shown in FIG. 3.

As shown schematically in FIG. 5, a gas introduced into the vacuum vessel 42 turns to a plasma as the result of discharge that occurs at the sputter electrode 44, whereupon positive ions Ip such as Ar ion are generated to create a plasma space P between the sputter electrode 44 and the substrate holder 48, namely, between the target material TG held on the sputter electrode 44 and the substrate SB held on the substrate holder 48. The generated positive ions Ip sputter the target material TG. The constituent elements Tp of the target material TG sputtered with the positive ions Ip are released from the target material TG and vapor-deposited, in either a neutral or ionized state, on the substrate SB.

The potential of the plasma space P is the plasma potential Vs (V). In the present invention, the substrate SB is typically an insulator and electrically insulated from the ground. Therefore, the substrate SB is "floating" and its potential is the floating potential Vf (V). The constituent elements Tp of the target material TG, as they occur between the target material TG and the substrate SB, are assumed to collide with the substrate SB in the process of film deposition, possessing a kinetic energy equivalent to the accelerating voltage of Vs–Vf which is the difference between the potential of the plasma space P and that of the substrate SB.

Figure 6:
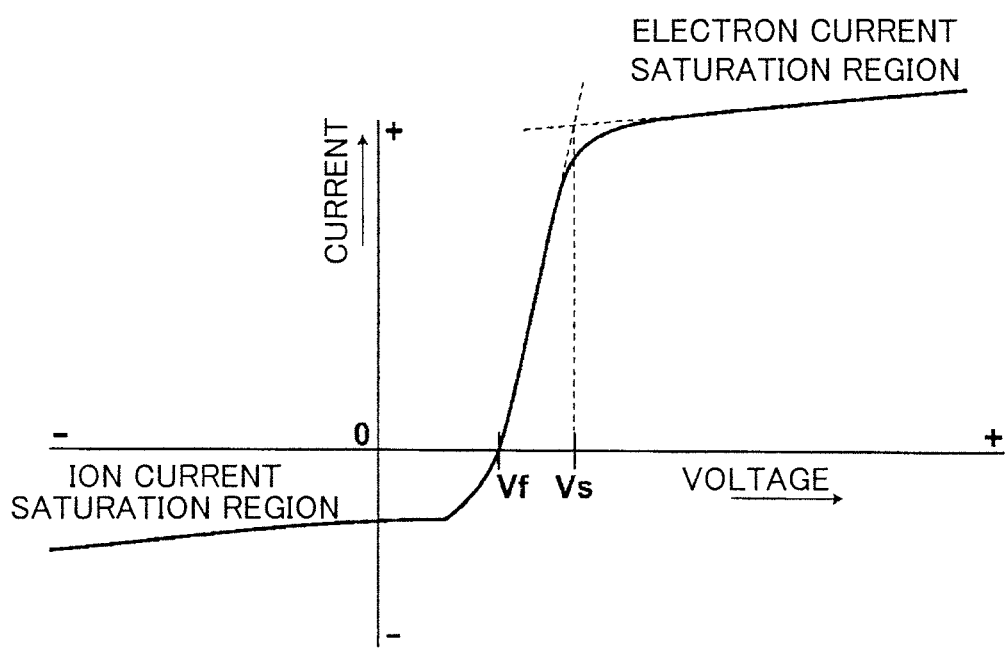
FIG. 6 is a diagram showing how the plasma potential Vs and the floating potential Vf are measured in the sputtering system.

The plasma potential Vs and the floating potential Vf can be measured with a Langmuir probe. Insert the tip of a Langmuir probe into the plasma P and apply a varying voltage to the probe, whereupon one obtains a current vs. voltage characteristic curve as shown in FIG. 6 (*Purazuma to seimaku no kiso* (Fundamentals of Plasma and Film Deposition) by Mitsuharu Konuma, p. 90, THE NIKKAN KOGYO SHIMBUN, LTD.) In FIG. 6, the floating potential Vf is the probe potential at which no current flows. This is the point at which the ionic current and the electronic current flow to the probe surface in equal amounts. It is this floating potential that is exhibited by metal surfaces or substrate surfaces if they are insulated. As the probe voltage becomes higher than the floating potential Vf, the ionic current gradually decreases until it becomes zero and only the electronic current reaches the probe. The voltage at this transition point is the plasma potential Vs.

The potential difference Vs–Vf between the plasma space P and the substrate SB may be varied by, for example, providing the ground between the substrate SB and the target material TG.

Factors that may influence the characteristics of films to be deposited by plasma-enhanced sputtering include: the film deposition temperature, the type of the substrate, the composition of any previously deposited film on the substrate, the surface energy of the substrate, the film deposition pressure, the amount of oxygen in the environmental gas, the power applied, the substrate-target distance, the electronic temperature and density in the plasma, as well as the active species density and life in the plasma.

The present inventors have found that, with respect to the preparation of the piezoelectric layer, among the many factors in film deposition, the film deposition temperature Ts and the potential difference Vs–Vf are critical to the characteristics of the film to be deposited and they have also found that films of good quality can be deposited by controlling those factors to appropriate values. To be more specific, the present inventors have found that films of good quality can be deposited within a certain range of a film characteristics profile when the film deposition temperature Ts is plotted on the horizontal axis and the potential difference Vs–Vf on the vertical axis (see FIG. 7).

As already shown, the potential difference Vs–Vf correlates with the kinetic energy of the constituent elements Tp from the target material TG that collide with the substrate SB. As the following equation shows, the kinetic energy E is generally represented by a function of temperature T, so it may be assumed that the potential difference Vs–Vf has the same effect on the substrate SB as the temperature has:

$$E=1/2mv^2=3/2kT$$

(where m is the mass, v is the velocity, k is a constant, and T is the absolute temperature.)

In addition to the temperature-like effect, the potential difference Vs–Vf is assumed to have such effects as promoting surface migration and etching weakly bonded portions.

JP 2004-119703 A proposes that in the process of depositing a piezoelectric film by sputtering, a bias be applied to the substrate in order to relax the tensile stress on the piezoelectric film. Applying a bias to the substrate means varying the amount of energy of the constituent elements from the target by which the substrate is bombarded. However, JP 2004-119703 A refers to neither the plasma potential Vs nor the potential difference Vs–Vf which is the difference between the plasma potential Vs and the floating potential Vf.

With conventional sputtering and other film depositing systems, the potential difference Vs–Vf as between the plasma space P and the substrate SB is virtually determined by the system design and cannot be largely varied, so there has been little motivation to change the potential difference Vs–Vf. JP 10-60653 A, although it does not concern a sputtering method, discloses controlling the potential difference Vs–Vf to lie within a specified range when an amorphous silicon film or the like is to be deposited by RF plasma-enhanced CVD. In that invention, the potential difference Vs–Vf is controlled to lie within the specified range in order to prevent it from becoming uneven on the substrate surface. However, JP 10-60653 A is silent about determining the conditions of film deposition on the basis of the relation between the film deposition temperature Ts, the potential difference Vs–Vf, and the characteristics of the film to be deposited.

The film deposition method under discussion is applicable to any kind of films that can be deposited by sputtering or other plasma-enhanced vapor deposition.

The low-resistance metal layer of the multilayer body according to the present invention can be prepared by the film deposition method by sputtering or the like. In the case of, for example, a gold-containing layer, an alloy containing gold and other metals such as iridium at a predetermined amount ratio can be used for the target material to obtain a desired gold-containing layer. The gold-containing layer may also be obtained by simultaneously sputtering using, for the target materials, two or more types of targets containing gold and other metals, respectively.

The adhesive metal sublayers and metal sublayer included in the low-resistance metal layer can also be prepared by the sputtering method using the predetermined target materials.

The upper electric layer formed on the piezoelectric layer can also be prepared by the film deposition method by sputtering.

The film deposition method by sputtering can preferably be applied in forming the piezoelectric layer. The present inventors have found that if the film deposition method is to be applied in depositing piezoelectric films that are made of one or more perovskite oxides which are represented by the following general formula (P):

$$A_aB_bO_3 \quad \text{General formula (P)}$$

(wherein A is a site A element, or at least one element selected from the group containing Pb; B is a site B element, or at least one element selected from the group consisting of Ti, Zr, V, Nb, Ta, Cr, Mo, W, Mn, Sc, Co, Cu, In, Sn, Ga, Zn, Cd, Fe, and Ni; and O is oxygen; the standard case is where a=1.0 and b=1.0, provided that a departure from this standard is tolerated within the range over which the perovskite structure can be realized), the conditions of film deposition are preferably determined in such a way that the following relations (1) and (2):

$$Ts(° C.) \geq 400 \quad (1)$$

$$-0.2Ts+100 < Vs-Vf(V) < -0.2Ts+130 \quad (2)$$

are satisfied (see FIG. 7).

The present inventors have found that in the case of depositing piezoelectric films that are made of perovskite oxides represented by the above general formula (P), the film deposition condition of Ts (° C.)<400 which does not satisfy the above-mentioned relation (1) involves such a low film deposition temperature that perovskite crystals will not grow satisfactorily but that instead a pyrochlore-phase rich film is deposited (see FIG. 7).

The present inventors have further found that in the case of depositing piezoelectric films that are made of perovskite oxides represented by the above general formula (P), the condition of Ts (° C.)≥400 which satisfies the above-mentioned relation (1) assures that by determining such a film deposition condition that the film deposition temperature Ts and the potential difference Vs–Vf satisfy the above-mentioned relation (2), pyrochlore-phase lean perovskite crystals can be grown consistently and yet Pb loss can be suppressed consistently to achieve consistent deposition of piezoelectric films of good quality that are satisfactory in terms of crystal structure and film composition (see FIG. 7).

It has been known that PZT film deposition by sputtering tends to suffer Pb loss if the film deposition temperature is unduly high (see FIG. 2 of JP 6-49638 A). The present inventors have found that Pb loss depends not only on the film deposition temperature but also on the potential difference Vs–Vf. Among Pb, Zr and Ti that are the constituent elements of PZT, Pb has the highest sputtering yield and is most easily sputtered. For example, according to Table 8.1.7 in *Shinku Handobukku* (Handbook of Vacuum Technology) (ed. by ULVAC, Inc. and published by Ohmsha, Ltd.), the sputtering yield under the condition of a 300 eV Ar ion is 0.75 for Pb, 0.48 for Zr, and 0.65 for Ti. Easy sputtering means that sputtered atoms, after being deposited on a substrate surface, can be easily re-sputtered. The greater the difference between the plasma potential and the substrate potential, namely, the larger the value of Vs–Vf, the higher the chance of re-sputtering and the more likely it is for Pb loss to occur. The same holds true for Pb-containing perovskite oxides other than PZT. The same holds true for plasma-enhanced vapor deposition techniques other than sputtering.

If each of the film deposition temperature Ts and the potential difference Vs–Vf is unduly small, the tendency is against satisfactory growth of perovskite crystals. If either the film deposition temperature Ts or the potential difference Vs–Vf or both are excessive, there is a greater tendency for Pb loss to occur.

In other words, given the condition of Ts (° C.)≥400 which satisfies the above-mentioned relation (1) and if the film deposition temperature Ts is relatively low, the potential difference Vs–Vf needs to be relatively high in order to ensure that perovskite crystals will grow satisfactorily but if the film deposition temperature Ts is relatively high, the potential difference Vs–Vf needs to be relatively low in order to suppress Pb loss. These conditions are expressed by the above-mentioned relation (2).

The present inventors have found when depositing piezoelectric films that are made of perovskite oxides which are represented by the above-mentioned general formula (P), piezoelectric films having high piezoelectric constants can be obtained by determining the conditions of film deposition in such a way that the following relations (1) to (3) are satisfied:

$$Ts(° C.) \geq 400 \quad (1)$$

$$-0.2Ts+100 < Vs-Vf(V) < -0.2Ts+130 \quad (2)$$

$$10 \leq Vs-Vf(V) \leq 35 \quad (3)$$

The present inventors have found that in the case of depositing piezoelectric films that are made of perovskite oxides represented by the above general formula (P), perovskite crystals can be grown without Pb loss by setting the potential difference Vs–Vf (V) to about 42 V at a film deposition temperature Ts of about 420° C., but that the resulting films have a piezoelectric constant $d_{31}$ of as low as about 100 pm/V. It is believed that, under this condition, the potential difference Vs–Vf, in other words, the energy of the constituent elements Tp from the target material TG that collide with the substrate is excessively high to easily cause film defects, thus lowering the piezoelectric constant. The present inventors have found that piezoelectric films with $d_{31} \geq 130$ pm/V can be deposited by determining the film deposition conditions in such a way that the above-mentioned relations (1) to (3) are satisfied.

In plasma-enhanced vapor deposition techniques such as sputtering, the film deposition temperature Ts (° C.) and Vs–Vf (V) which is the difference between the plasma potential Vs (V) in the plasma and the floating potential Vf (V) during film deposition are two factors that affect the characteristics of the film obtained.

The film deposition method is so designed that the conditions of film deposition are determined based on the relation between the above-mentioned two factors that affect the film characteristics and the characteristics of the film deposited; as a result, films of good quality can be deposited consistently by plasma-enhanced vapor deposition techniques such as sputtering.

By adopting the film deposition method of the present invention, one can easily identify conditions that enable films of good quality to be deposited even if the system conditions are changed and, as a result, films of good quality can be deposited consistently.

As described above, the film deposition method by sputtering can preferably be applied in forming the piezoelectric layer. Particularly when applied in depositing piezoelectric layer made of perovskite oxides, the film deposition method enables consistent growth of perovskite crystals with a smaller content of the pyrochlore phase. In addition, there can be obtained the piezoelectric layer that comprises Pb-containing perovskite oxides such as PZT, which result from stable growth of perovskite crystals with a smaller content of the pyrochlore phase, and which yet are characterized in that Pb loss is suppressed consistently.

[Piezoelectric Element and Liquid Ejecting Device Equipped with the Same]

Next, the constructions of the piezoelectric element and the liquid ejecting device equipped with the same according to the present invention are described. An ink-jet head in an embodiment of the liquid ejecting device of the present invention is described below. FIG. 8 is a sectional view showing the essential parts of an embodiment of the ink-jet head that uses an embodiment of the piezoelectric element of the present invention (as seen through the thickness of the piezoelectric element). To facilitate viewing, the individual components of the device are not to scale.

As shown in FIG. 8, the ink-jet head of the present invention which is generally indicated by 50 comprises a piezoelectric element 52 according to the present invention, an ink storing/ejecting member 54, and a diaphragm 56 provided between the piezoelectric element 52 and the ink storing/ejecting member 54.

First, the piezoelectric element of the present invention is described. As shown in FIG. 8, the piezoelectric element 52 is an element comprising a substrate 58 on which a lower electrode layer 60, a piezoelectric layer 62 and an upper electrode layer 64 are superposed in that order; the piezoelectric element 52 is so designed that the lower electrode layer 60 and the upper electrode layer 64 apply an electric field to the piezoelectric layer 62 in the direction of its thickness.

The lower electrode layer 60 is formed to cover generally the entire surface of the substrate 58 and on top of it is formed a striped pattern of piezoelectric film 62 that consists of linear stripes of high spot 62a that extend into the paper on which FIG. 8 is drawn, with the upper electrode layer 64 being formed on top of each of the high spots 62a.

The pattern of the piezoelectric layer 62 is not limited to the illustrated case and may be designed as appropriate. The piezoelectric layer 62 may be continuous; however, by forming the piezoelectric layer 62 not as a continuous film but in a pattern that consists of a plurality of discrete high spots 62a, the individual high spots 62a will expand or contract smoothly enough to produce a greater amount of displacement, which is preferred for the purpose of the present invention.

The ink-jet head 50 shown in FIG. 8 generally comprises the piezoelectric element 52 of the above-described structure having the ink storing/ejecting member 54 fitted on the lower side of the substrate 58 with the diaphragm 56 interposed; the ink storing/ejecting member 54 has ink storing compartments (ink reservoirs) 68 and ink orifices (nozzles) 70 through which ink is ejected from the ink reservoirs 68 to the outside. The number of ink reservoirs 68 is determined by the number of high spots 62a in the piezoelectric layer 62 and the pattern they form. In other words, the ink-jet head 50 has a plurality of ejection portions 71, and the piezoelectric layer 62, upper electrode layer 64, ink reservoir 68 and ink nozzle 70 are provided for each of the ejection portions 71. On the other hand, the lower electrode layer 60, substrate 58 and diaphragm 56 are provided for the plurality of ejection portions 71. However, this is not the sole case and these elements may be provided for each ejection portion or for each group composed of several ejection portions.

The ink-jet head 50 may be driven by a preferred method that is described below or by any conventionally known method so that the strength of electric field being applied to the high spots 62a in the piezoelectric element 52 is adjusted for each of those high spots 62a to either expand or contract, thereby controlling ink ejection, for example, the amount in which the ink is ejected from the individual ink reservoirs 68.

Described above are the basic structure of the piezoelectric element according to the embodiment of the present invention and the ink-jet head that employs this piezoelectric element.

In the next place, the drive method that may be applied to the ink-jet head of the present invention is described with reference to FIGS. 9 to 12E. While the ink-jet head of the present invention is preferably driven by the method described below, this is not the sole case of the present invention and it may of course be driven by any conventionally known method.

FIG. 9 is a graph showing an exemplary bipolar waveform for driving the ink-jet head. FIG. 10 is a graph showing an exemplary unipolar waveform for driving the ink-jet head. FIG. 11 is a plot of voltage vs. time for a drive signal containing a number of multipulse waveforms. FIGS. 12A to 12E are schematic diagrams showing an example of the ejection of ink from an orifice in the ejecting portion in response to a multipulse waveform;

The drive method to be applied to the present invention is different from the conventional method which depends on a single drive pulse for ejecting a single drop of a desired volume through an orifice of a predetermined size and it enables a drop of the same volume to be ejected through an orifice of a smaller size in response to a plurality of drive pulses.

To be more specific, according to the ink-jet head drive method under consideration, a multipulse waveform containing two or more drive pulses is applied to the piezoelectric element so that one, namely, a single ink drop is ejected from one ejecting portion in the ink-jet head, with the drive pulse frequency being greater than the natural frequency, $f_j$, of the ink-jet head (ejecting portion).

An example of the multipulse waveform that may be used in the drive method is shown in FIG. 9. While FIG. 9 refers to the case where the multipulse waveform consists of four drive pulses, it may be composed of two or three drive pulses or even five or more drive pulses. It should also be noted that FIG. 9 refers to the case where each drive pulse consists of a bipolar waveform represented by normalized voltage (V/Vmax) and normalized time.

The drive pulse frequency is preferably higher than the natural frequency, $f_j$, of the ejecting portion; for example, it is preferably 1.3 times $f_j$ or greater, more preferably 1.5 times $f_j$ or greater, even more preferably between 1.5 and 2.5 times $f_j$, and most preferably between 1.8 and 2.2 times $f_j$.

The plurality of drive pulses may be pulses having the same pulse period or pulses having different pulse periods.

The plurality of drive pulses may consist of bipolar pulses having a negative (−) component Sm and a positive (+) component Sp as shown in FIG. 9, or may consist of unipolar pulses having only a positive (+) component as shown in FIG. 11; alternatively, they may consist of unipolar pulses having only a negative (−) component; if desired, they may consist of both positive (+) and negative (−) unipolar pulses, or they may even be mixed pulses comprising not only such positive and negative unipolar pulses but also bipolar pulses. The periods of drive pulses, tp, may be the same or different.

The amplitudes of respective drive pulses which correspond to a maximum or minimum voltage applied to the ejecting portion may be substantially the same or different but it is preferred that any drive pulse have a greater amplitude than earlier drive pulses.

In a preferred embodiment of the drive method, in order to ensure that the liquid ejecting device ejects a single droplet in response to a plurality of pulses, it is preferred to use a waveform comprising one or more pulses each having a period not longer than 20 microseconds, more preferably not longer than 12 microseconds, and even more preferably not longer than 10 microseconds.

In addition, to ensure that the liquid ejecting device ejects a single droplet of a fluid in response to two or more pulses, it is preferred to use a multipulse waveform comprising two or more pulses each having a period not longer than about 25 microseconds, more preferably not longer than 12 microseconds, and even more preferably not longer than 8 microseconds and most preferably not longer than 5 microseconds.

Droplets preferably have a mass between 1 picoliter and 100 picoliters.

In the drive method described above, the harmonic components of a plurality of drive pulses at the natural frequency $f_j$ of the ejecting portion are 50% or less, more preferably 25% or less, and even more preferably 10% or less, of the harmonic components of the plurality of drive pulses at $f_{max}$ which is the frequency of the maximum component.

In the drive method described above, it is preferred that at least 60% of the droplet's mass be included within the radius, r, of a point in the droplet, where r corresponds to the radius of a perfectly spherical droplet which is given by the following formula: where $m_d$ is the droplet's mass and $\rho$ is the fluid's density.

$$\sqrt[3]{\frac{3m_d}{4\pi\rho}}$$

In the case under consideration, the droplet preferably has a velocity of at least 4 ms$^{-1}$, more preferably at least 6 ms$^{-1}$, and even more preferably at least 8 ms$^{-1}$. It is preferred that at least 80%, more preferably at least 90%, of the droplet's mass be included within the above-defined sphere.

In the drive method under consideration, the multipulse waveform is typically composed of continuous pulses but it may include discontinuous pulses.

During printing with the ink-jet head, a number of droplets are ejected from the respective ejecting portions by driving them with a number of multipulse waveforms. As shown in FIG. 10, multipulse waveforms 210 and 220 are respectively followed by delay periods 212 and 222 so that the multipulse waveform 210 is separated from the multipulse waveform 220 and the latter from the subsequent multipulse waveform. One droplet is ejected in response to the multipulse waveform 210 and another droplet is ejected in response to the multipulse waveform 220. The multipulse waveforms 210 and 220 each consist of four drive pulses as shown in FIG. 9 but they may each consist of no more than three drive pulses or at least five drive pulses; on the other hand, the delay period 212 or 222 is preferably longer than the total period of the multipulse waveform 210 or 220 (the total period being the sum of four drive pulses), at least twice the total period of one multipulse waveform, with an integral multiple of that total period (the integer≧2) being particularly preferred.

Described below are the growth and ejection of a single ink droplet in response to a multipulse waveform consisting of a plurality of drive pulses in the drive method under consideration.

FIGS. 12A to 12E are schematic diagrams showing the growth and ejection of a single ink droplet in response to a multipulse waveform.

As these figures show, the volume of a single ink droplet which is to be ejected from the ejecting portion in response to a multipulse waveform that consists of a plurality of drive pulses increases progressively with the application of the next drive pulse and eventually the droplet is separated and ejected as a single ink droplet.

Figure 12E:
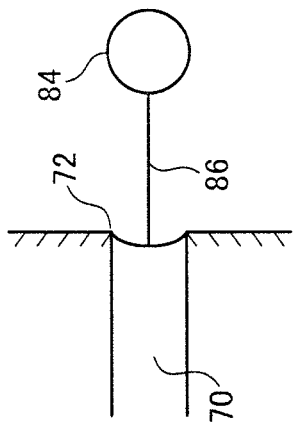
Figure 12C:
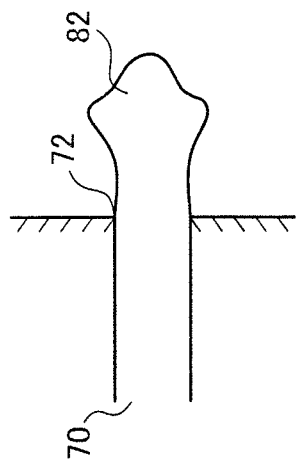
Figure 12D:
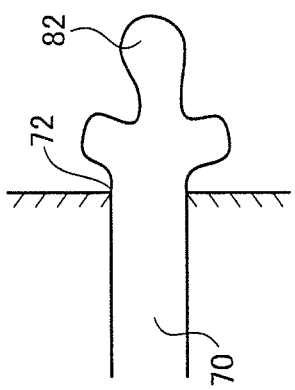
Figure 12A:
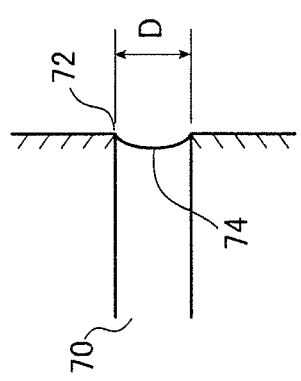
Figure 12B:
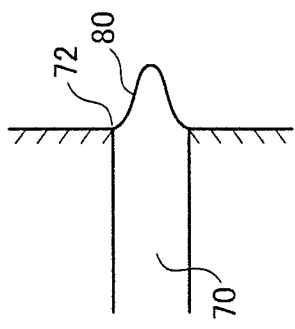

First, prior to the application of an initial drive pulse, the ink within the ink reservoir 68 (see FIG. 8) forms a meniscus 74 curved slightly backward from the orifice 72 of a nozzle 70 under the internal pressure (see FIG. 12A).

If the orifice 72 is circular in cross section, D represents its diameter. Here the diameter D can be determined by the ink-jet design and droplet size requirements. For example, the diameter D can be set somewhere between about 10 μm and 200 μm, preferably between about 20 μm and 50 μm. The initial pulse pushes out a first predetermined volume of ink through the orifice 72, causing an ink surface 80 to protrude slightly from the nozzle 70 (see FIG. 12B).

Before the first part of the ejected droplet separates or contracts, a second pulse pushes out another predetermined volume of ink through the nozzle 70, which is added to the ink already protruding from the nozzle 70.

In this way, the volume of the ink protruding from the nozzle 70 increases and the ink droplet grows. The ink pushed out in response to the second pulse and the ink pushed out in response to a third pulse each contribute to increasing the volume of the ink droplet and adding a momentum, as shown in FIGS. 12C and 12D. Thus, the ink volume increases upon application of continuous drive pulses and, as shown in FIGS. 12C and 12D, the droplet that is being formed in the orifice 72 bulges out.

Finally, upon application of a fourth drive pulse, the nozzle 70 ejects one, or a single, ink droplet 84 and the meniscus 74 returns to its initial position (see FIGS. 12E and 12A). FIG. 12E shows an extremely thin tail that connects the ink droplet head to the nozzle 70. The size of the tail is substantially smaller than would occur in droplets that are formed using the conventionally known single pulse and a larger nozzle.

To be more specific, by applying the drive method under consideration and assuming that the same single ink droplet is to be ejected, the size of a nozzle, for example, the diameter of the orifice through which an ink droplet is ejected in response to the conventionally known single pulse can be substantially reduced. For example, in the case of using a multipulse waveform consisting of four drive pulses, the nozzle size can be reduced to about a quarter of the conventional size. What is more, the drive method under consideration can minimize the tail of an ejected ink droplet. As a result, the drive method under consideration offers the advantage of preventing the tiny separated droplets such as satellites or splashes that would otherwise occur from the tails of ink droplets.

Described above are the basic features of the drive method that is applicable to the ink-jet head of the present invention.

We now describe the construction of an ink-jet recording device that is equipped with the ink-jet head according to the present invention. FIG. 13 is an overall system view showing the general layout of an embodiment of the ink-jet recording device equipped with the ink-jet head of the present invention, and FIG. 14 is a partial top view of the ink-jet recording device shown in FIG. 13.

The illustrated ink-jet recording device which is generally indicated by 100 basically includes a printing unit 102 having a plurality of ink-jet heads (which are hereinafter referred to simply as "heads") 50K, 50C, 50M and 50Y that are classified by ink color, ink storing/filling units 114 for storing the inks to be supplied to the respective heads 50K, 50C, 50M and 50Y, a paper feed unit 118 for supplying recording paper 116, a decurling unit 120 for removing any curl from the recording paper 116, a suction belt transport unit 122 that is placed in a face-to-face relationship with the nozzle tips (ink ejecting surface) of the printing unit 102 and which transports the recording paper 116 while maintaining its flatness, a print detecting unit 124 which reads the result of printing with the printing unit 102, and a paper ejecting unit 126 by means of which the printed recording paper (print) is ejected to the outside.

Each of the heads 50K, 50C, 50M and 50Y that constitute the printing unit 102 is the ink-jet head 50 according to the above-described embodiment (see FIG. 8).

In the decurling unit 120, a heating drum 130 applies heat to the recording paper 116 in a direction opposite the direction in which the paper has been rolled and the heat thus applied effectively removes the curl.

In a device that uses a roll of paper, a cutter 128 is provided downstream of the decurling unit 120 and it is by means of this cutter that the roll of paper is cut to a desired size. The cutter 128 comprises a fixed blade 128A whose length is at least equal to the width of the transport path for the recording paper 116 and a circular blade 128B that moves along the fixed blade 128A; the fixed blade 128A is provided on the side away from the print side whereas the circular blade 128B is provided on the print side which is the other side of the transport path. The cutter 128 need not be provided in a device that uses cut sheets of paper.

The decurled and cut recording paper 116 is sent to the suction belt transport unit 122. The suction belt transport unit 122 is of such a structure that an endless belt 133 is stretched between rollers 131 and 132 and at least the portion of that unit which is in a face-to-face relationship with the nozzle tips of the printing unit 102 and the sensor side of the print detecting unit 124 forms a level (flat) surface.

The belt 133 has a greater width dimension than the recording paper 116 and has a number of suction holes (not shown) bored through its thickness. Inside the belt 133 which is stretched between the rollers 131 and 132 and in a position that faces the nozzle tips of the printing unit 102 and the sensor side of the print detecting unit 124, there is provided a suction chamber 134 which is aspirated with a fan 135 to create a negative pressure that sucks the recording paper 116 on the belt 133 and holds it in position.

The power of a motor (not shown) is transmitted to at least one of the rollers 131 and 132 between which the belt 133 is stretched, whereupon the belt 133 is driven clockwise as seen in FIG. 13 and the recording paper 116 held on the belt 133 is transported from left to right in FIG. 13.

Note that if a borderless print or the like is made, ink also adheres onto the belt 133, so in order to deal with this problem, a belt cleaning unit 136 is provided outside the belt 133 and in a predetermined position (any appropriate position other than the print region).

Above the recording paper transport path that is formed of the suction belt transport unit 122, a heating fan 140 is provided upstream of the printing unit 102. The heating fan 140 blows heated air onto the recording paper 116 before printing and heats it. Heating the recording paper 116 just before printing contributes to making the ink quicker to dry after it is landed on the recording paper 116.

The printing unit 102 is composed of "full-line" heads, or linear heads each having a length corresponding to the maximum paper width and being arranged in a main scanning direction, or a direction perpendicular to the direction of paper feed (see FIG. 14). Each of the heads 50K, 50C, 50M and 50Y is composed of a linear head in which a plurality of ink orifices (nozzles) are arranged to extend over a length that exceeds at least one side of the recording paper 116 of the largest size that the ink-jet recording device 100 can handle.

Arranged from upstream to downstream direction of the feed of the recording paper 116 are the heads 50K, 50C, 50M and 50Y, in that order, which are associated with inks of respective colors of black (K), cyan (C), magenta (M) and yellow (Y). As the recording paper 116 is transported, the heads 50K, 50C, 50M and 50Y eject inks of their associated colors to record a color image on the recording paper 116.

The print detecting unit 124 comprises a line sensor or the like which images the result of droplet deposition from the printing unit 102, and based on the droplet-deposited image as read by the line sensor, the unit 124 detects any defect in ejection such as nozzle clogging.

Provided downstream of the print detecting unit 124 is a post-drying unit 142 that typically comprises a heating fan for drying the printed image surface. Since contact with the print surface is preferably avoided until after the printed ink has dried up, blowing hot air against the print surface is a preferred drying method.

Provided downstream of the post-drying unit 142 is a heating/pressing unit 144 for controlling the gloss of the image surface. In the heating/pressing unit 144, the image surface, while it is heated, is pressed by a press roller 145 having predetermined surface asperities so that the surface asperities are transferred to the image surface.

The print thus obtained is ejected from the paper ejecting unit 126. The image to be printed (i.e., the print of the desired image) is preferably ejected as a separate article from a test print. The ink-jet recording device 100 under consideration is provided with a selector means (not shown) that selects between the print of the desired image and the test print and which switches the paper ejecting path such that it guides the print of the desired image to an ejector 126A and the test print to another ejector 126B.

In the case where the print of the desired image and the test print are simultaneously made side by side on a larger size of recording paper, a cutter 148 may be provided to cut off the portion of the paper on which the test print has been made.

Described above is the basic construction of the ink-jet recording device according to the embodiment under consideration.

While the multilayer body, the thin-film devices such as piezoelectric elements using the multilayer body, the ink-jet head, and the ink-jet recording device have been described on the foregoing pages in detail with reference to various embodiments, it should be understood that the present invention is by no means limited to those embodiments and various improvements and design changes may of course be made without departing from the spirit and scope of the invention.

EXAMPLES

Examples of the invention are provided below by way of illustration.

Example 1

A model STV4320 sputtering system manufactured by Shinko Seiko Co., Ltd. was used as the sputtering system 40 shown in FIG. 3. In this system 40, either a grounded or floating state may be selected for the substrate holder 48. A high-frequency power supply 46 which is capable of applying a high-frequency power of up to 1 kW was used.

A substrate having a size of 5 cm square obtained by initially forming a 100 nm thermal oxide film ($SiO_2$ film) on a silicon wafer was used as the substrate SB.

The distance between the target material TG and the substrate SB was set to 60 mm. Film formation was subsequently carried out at the same distance.

Using a TiW (tin content, 10 at %) alloy as the target material TG and setting the substrate temperature to 350° C., argon (100%) gas was introduced to the system and a first TiW layer (first adhesive metal sublayer) having a thickness of 20 nm was formed under a pressure of 0.9 Pa.

Next, a gold-containing sublayer (thickness, 330 nm) was formed on the TiW layer-bearing silicon wafer by simultaneous sputtering using iridium metal and gold metal as the target materials TG. Sputtering was carried out under the following conditions: substrate temperature, 350° C.; introduction of argon (100%) gas; pressure, 0.1 Pa. The compositional ratio of the resulting gold-containing layer was gold, 90 at %; iridium, 10 at %.

A second TiW layer (second adhesive metal sublayer; thickness, 20 nm) was then deposited on the resulting gold-containing sublayer under the same conditions as above.

Using iridium metal as the target TG, an iridium layer (thickness, 150 nm) was then formed on the second adhesive metal sublayer. The sputtering conditions were as follows: substrate temperature, 350° C.; introduction of argon (100%) gas; 0.1 Pa.

Measurement of the sheet resistivity for the low-resistance metal layer composed of the first adhesive metal sublayer formed on the silicon wafer, the gold-containing sublayer, the second adhesive metal sublayer and the iridium layer (metal sublayer) yielded a value of 0.5Ω/□. Measurement was carried out by the four-point probe method.

In addition, the above low-resistance metal layer in which the surfacemost portion was an iridium layer had a mean surface roughness Ra of 50 Å. Measurement was carried out with a surface profilometer.

Using $Pb_{1.3}Zr_{0.52}Ti_{0.48}O_3$ as the target TG, a piezoelectric layer (thickness, 4 μm) composed of PZT was formed on the low-resistance metal layer. The sputtering conditions were as follows: substrate temperature, 475° C.; introduction of argon (volume ratio, 97.5%)+$O_2$ (volume ratio, 2.5%); 0.5 Pa. X-ray diffraction (XRD) analysis of the piezoelectric layer showed that the formation of perovskite crystals with a crystalline orientation (FIG. 15).

Following fabrication of the piezoelectric layer, the sheet resistivity of the low-resistance metal layer was measured and found to be 0.45Ω/□. The percent change in the sheet resistivity of the low-resistance metal layer before and after heating at 475° C., which was the temperature during formation of the piezoelectric layer, was only −10%.

The piezoelectric layer had a mean surface roughness Ra of 55 Å.

The silicon wafer having a low-resistance metal layer thereon prior to formation of the piezoelectric layer was heat-treated at 475° C., which was the same temperature as during piezoelectric layer formation, and the mean surface roughness Ra of the low-resistance metal layer was measured. The mean surface roughness Ra of the low-resistance metal layer was 50 Å, which was substantially the same as the mean surface roughness prior to heat treatment.

Comparative Example 1

A first TiW layer (first adhesive metal sublayer, thickness, 20 nm) was formed by the same method as in Example 1 on a silicon wafer having a thermal oxide film ($SiO_2$ film; thickness, 100 nm) thereon.

Next, using gold as the target, a gold layer (thickness, 300 nm) composed of gold (Au) was formed on the TiW layer-bearing silicon wafer under the same conditions as in Example 1.

A second TiW layer (second adhesive metal sublayer, thickness, 20 nm) was then formed on the gold layer, and an iridium layer (thickness, 150 nm) was formed on the second TiW layer, under the same conditions as in Example 1.

The sheet resistivity of the resulting low-resistance metal layer composed of a first adhesive metal sublayer, a gold layer, a second adhesive metal sublayer and an iridium layer (metal sublayer) that was formed on the silicon wafer was then measured, yielding a value of 0.2Ω/□.

In addition, the above low-resistance metal layer in which the surfacemost portion was an iridium layer had a mean surface roughness Ra of 130 Å, indicating very dramatic surface irregularities compared with Example 1.

Also, a piezoelectric layer was formed on the low-resistance metal layer under the same conditions as in Example 1. X-ray diffraction (XRD) analysis of the piezoelectric layer showed that a pyrochlore phase had formed.

Following fabrication of the piezoelectric layer, the sheet resistivity of the low-resistance metal layer was measured and found to be 0.45Ω/□. The percent change in the sheet resistivity of the low-resistance metal layer before and after heating at 475° C., which was the temperature during formation of the piezoelectric layer, was 125%, which was very large compared with Example 1.

The piezoelectric layer had a mean surface roughness Ra of 48 nm. Compared with Example 1, the surface irregularities were very dramatic and cracks had formed.

The multilayer body of the present invention can be advantageously employed in piezoelectric elements for use in, for example, ink-jet recording heads, ferroelectric memories (FRAM), and pressure sensors.

What is claimed is:

1. A piezoelectric element comprising a multilayer body comprising:
   a substrate; and
   a low-resistance metal layer which is formed on the substrate and has a multilayer structure of two or more sublayers,
   wherein the low-resistance metal layer comprises a gold-containing sublayer comprising gold and another metal,
   wherein the low-resistance metal layer comprises the gold-containing sublayer and a metal sublayer formed on the gold-containing sublayer, which metal sublayer is situated at a surfacemost portion of the low-resistance metal layer on the opposite side thereof form the substrate,
   which piezoelectric element further comprises:
   an electrode substrate wherein the low-resistance metal layer serves as a lower electrode layer,
   a piezoelectric layer formed on the lower electrode layer of the electrode substrate, and
   an upper electrode layer formed on the piezoelectric layer.

2. The piezoelectric element of claim 1, wherein the low-resistance metal layer has, at a top surface thereof, a mean surface roughness Ra of not more than 10 nm.

3. The piezoelectric element of claim 1, wherein the low-resistance metal layer further comprises, between the gold-containing sublayer and the metal sublayer, an adhesive metal sublayer.

4. The piezoelectric element of claim 1, wherein the metal sublayer is composed of iridium or platinum.

5. The piezoelectric element of claim 1, wherein the other metal is iridium.

6. The piezoelectric element of claim 1, wherein the low-resistance metal layer further comprises, on a substrate side thereof, an adhesive metal sublayer which causes the gold-containing sublayer and the substrate to mutually adhere.

7. The piezoelectric element of claim 1, wherein the substrate is a silicon substrate alone or a silicon substrate having a thermal oxide film on a side thereof where the low-resistance metal layer is formed.

8. The piezoelectric element of claim 1, wherein the low-resistance metal layer has a sheet resistivity of not more than 1Ω/□.

9. The piezoelectric element of claim 1, wherein the low-resistance metal layer has a percent change in sheet resistivity, before and after heat treatment in open air at a temperature of at least 450° C., of not more than ±20%.

10. The piezoelectric element of claim 1, wherein the gold-containing sublayer has a content of the other metal of from 0.5 to 50 at %.

11. The piezoelectric element of claim 1, wherein the low-resistance metal layer has a thickness of from 200 to 1,000 nm.

12. The piezoelectric element of claim 1, wherein the piezoelectric layer is obtained by heating the lower electrode layer at a temperature of at least 450° C. and using a vapor deposition process to form a piezoelectric material thereon.

13. The piezoelectric element of claim 1, wherein the piezoelectric layer is a perovskite oxide film.

14. The piezoelectric element of claim 1, wherein the piezoelectric layer has, at a top surface thereof, a mean surface roughness Ra of not more than 10 nm.

15. A liquid ejecting device comprising:
the piezoelectric element of claim 1,
a liquid holding chamber for holding a liquid, and
a liquid ejection port which, on application of a voltage to the piezoelectric element, is made to outwardly eject the liquid from the liquid holding chamber.

* * * * *